(12) United States Patent
Ono et al.

(10) Patent No.: US 8,976,608 B2
(45) Date of Patent: Mar. 10, 2015

(54) SEMICONDUCTOR INTEGRATED CIRCUIT DEVICE

(71) Applicant: Hitachi, Ltd., Chiyoda-ku, Tokyo (JP)

(72) Inventors: Goichi Ono, Souka (JP); Yusuke Kanno, Kodaira (JP); Akira Kotabe, Hino (JP)

(73) Assignee: Hitachi, Ltd., Tokyo (JP)

( * ) Notice: Subject to any disclaimer, the term of this patent is extended or adjusted under 35 U.S.C. 154(b) by 22 days.

(21) Appl. No.: 13/910,507

(22) Filed: Jun. 5, 2013

(65) Prior Publication Data
US 2013/0322188 A1    Dec. 5, 2013

(30) Foreign Application Priority Data
Jun. 5, 2012 (JP) ................................. 2012-127729

(51) Int. Cl.
| | |
|---|---|
| G11C 7/00 | (2006.01) |
| G11C 8/08 | (2006.01) |
| G11C 29/50 | (2006.01) |
| G11C 11/41 | (2006.01) |
| G11C 29/12 | (2006.01) |

(52) U.S. Cl.
CPC .. *G11C 7/00* (2013.01); *G11C 8/08* (2013.01); *G11C 29/50* (2013.01); *G11C 11/41* (2013.01); *G11C 2029/1202* (2013.01)

USPC ................................. 365/189.16; 365/189.06

(58) Field of Classification Search
USPC ................... 365/189.16, 189.06, 201, 189.11
See application file for complete search history.

(56) References Cited

U.S. PATENT DOCUMENTS

| | | | |
|---|---|---|---|
| 2007/0133317 A1* | 6/2007 | Yuan et al. ................ | 365/189.09 |
| 2009/0303818 A1* | 12/2009 | Kim ............................ | 365/201 |
| 2010/0226190 A1 | 9/2010 | Kobatake | |

FOREIGN PATENT DOCUMENTS

JP    2010-182344 A    8/2010

* cited by examiner

*Primary Examiner* — Vu Le
(74) *Attorney, Agent, or Firm* — Miles & Stockbridge P.C.

(57) ABSTRACT

A semiconductor integrated circuit device that detects an operation error of an SRAM caused by a device variation fluctuating with time is provided. In the SRAM, a memory cell has a transfer MOS transistor whose gate is connected to a word line. At the time of a write test of the memory cell, a control circuit including a test/normal operation selection circuit and a word line driver circuit applies a third voltage to the word line in a preparation period before writing test data, thereafter a first voltage to the word line, and a second voltage to the word line at the end of writing. Due to this, the threshold voltage of the transfer MOS transistor, which fluctuates with time, can be controlled. Therefore, it is possible to enhance detection efficiency for a malfunctioning cell of the SRAM due to a temporal variation.

12 Claims, 19 Drawing Sheets

SEMICONDUCTOR INTEGRATED CIRCUIT DEVICE

CROSS-REFERENCE TO RELATED APPLICATION

This application claims the priority of Japanese Patent Application No. 2012-127729 filed Jun. 5, 2012, which is incorporated herein by reference in its entirety.

BACKGROUND OF THE INVENTION

1. Field of the Invention

The present invention relates to a semiconductor integrated circuit device, and more particularly to a technique effectively applied to a semiconductor integrated circuit device having a static random access memory (SRAM).

2. Description of the Related Art

For example, in a semiconductor integrated circuit device, characteristic variations (for example, a threshold voltage fluctuation) of transistors are causes of the performance deterioration or malfunction of a semiconductor integrated circuit. In a technique of the semiconductor integrated circuit device, a power supply voltage is lowered with the progress of miniaturization, while the characteristic variations of transistors are increased. Therefore, the influence of the variations has continued to increase. The characteristic variations of transistors cause an operation error of a circuit according to the magnitude of variation. For example, for an SRAM, a noise margin for SRAM operation is reduced according to the magnitude of threshold voltage variation of transistors. As a result, a malfunctioning cell that cannot perform a read operation or a write operation in a normal way is generated. Therefore, the malfunctioning cell is detected by a screening test before shipment of a product, and countermeasures are taken.

As this type of related art, JP-A-2010-182344, for example, discloses a technique of changing the drive voltage of a word line in an operation mode and in a test mode. This is a technique of performing a test in a reduced noise margin state in the test mode, which is aimed at enhancing a detection effect of a defective cell.

Techniques in the related art, including JP-A-2010-182344 described above, are effective for an improvement in test efficiency for the past characteristic variations where the amount of variation is determined at the time of manufacture and thereafter the amount of variation does not change. In the related-art techniques, however, there is a risk of overlooking a malfunctioning cell in which the amount of variation fluctuates with time. This is because, although the cell will be defective due to a large amount of variation, the variation state of a transistor when performing a test operation may happen to be a variation not causing malfunction.

As an example in which the amount of variation temporally changes, there is a phenomenon called random telegraph noise (RTN) whose influence becomes outstanding in the process of miniaturization (refer to FIG. 2 described later). RTN is a phenomenon in which a transistor threshold voltage temporally fluctuates due to a small structural defect at an atomic level. Moreover, the temporal fluctuation has a random characteristic, in the related art, since a temporally fluctuating variation is not tested, a malfunctioning cell can be or cannot be detected depending on a threshold voltage state at the time of a test. Hence, since the cell that will cause malfunction at some future time is overlooked at the test, a design for strengthening a reliability measure such as error correcting code (ECC) is needed. Therefore, there arises a problem in that the degree of redundancy of an SRAM is increased to result in an increase in cost.

SUMMARY OF THE INVENTION

The invention has been made to solve such a problem, and it is an object of the invention to provide a semiconductor integrated circuit device that detects an operation error of an SRAM caused by a device variation fluctuating with time. The above and other objects and novel features of the invention will become apparent from the description of the specification and the accompanying drawings.

A typical outline of the invention disclosed herein will be described below.

That is, a semiconductor integrated circuit device according to a typical embodiment of the invention is an SRAM having a plurality of memory cells and a control circuit that controls the plurality of memory cells. The semiconductor integrated, circuit device has the following features. Each of the memory cells has a transfer MOS transistor whose gate is connected to a word line. The control circuit applies a first voltage to the word line at the time of a write operation of the memory cell, a second voltage to the word line at the end of the write operation, and a third voltage to the word line in a preparation period after selecting the memory cell and before writing test data.

An effect typically obtained by the invention disclosed herein will be briefly described. It is possible to improve detection efficiency for a malfunctioning cell of an SRAM due to a variation that the threshold voltage of a transistor fluctuates with time.

DESCRIPTION OF THE PREFERRED EMBODIMENTS

Figure 1:
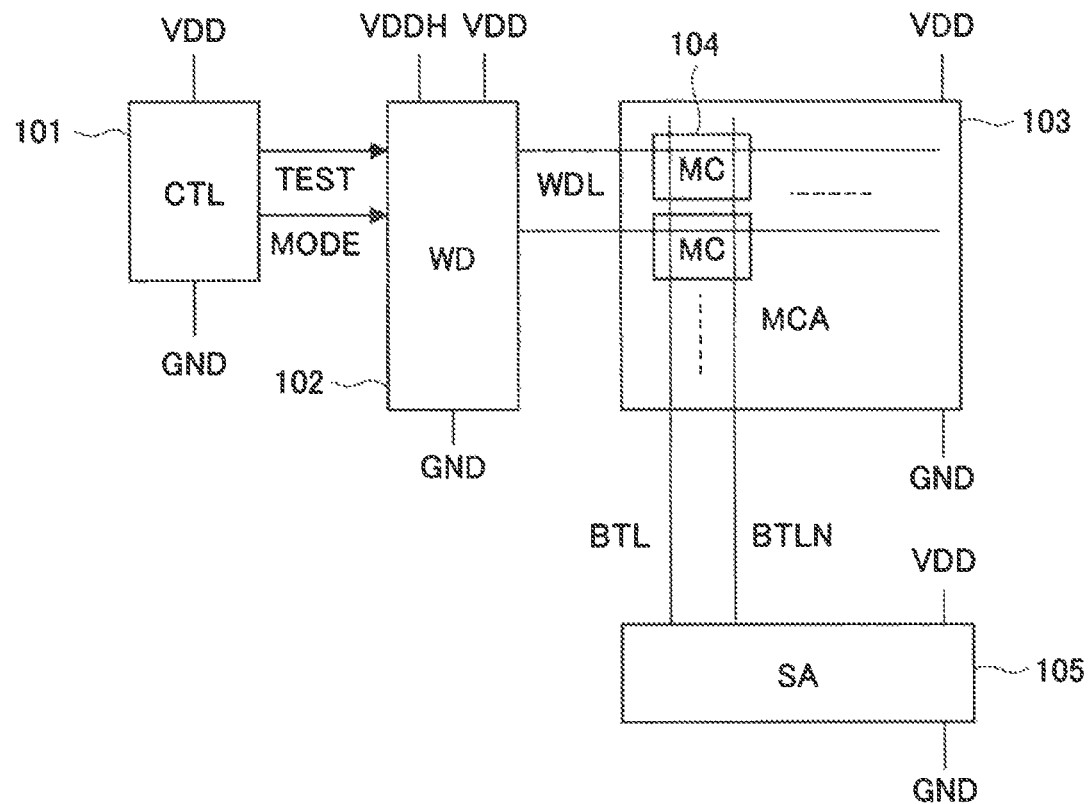
FIG. 1 is a block diagram showing a configuration example of a test method and circuit of an SRAM according to Embodiment 1 of the invention.

Hereinafter, embodiments of the invention will be described in detail based on the drawings. Throughout the drawings for describing the embodiments, the same members are denoted in principle by the same reference numeral and sign, and the repetitive description thereof is omitted. Moreover, in the embodiments described below, the invention will be described in a plurality of sections or embodiments when required as a matter of convenience. However, these sections or embodiments are not irrelevant to each other unless otherwise stated, and the one relates to the entire or a part of the other as a modified example, details, or a supplementary explanation thereof.

Moreover, in the embodiments described below, when referring to the number of elements (including number of pieces, numerical values, amount, and range), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

[Outline of Embodiment of the Invention]

First, regarding a test method and configuration of a semiconductor integrated circuit device according to a main embodiment of the invention, the configuration will be briefly described below. As one example, the corresponding component, reference numeral and sign, or the like is described in parentheses.

The semiconductor integrated circuit device of the embodiment can be applied generally to a semiconductor integrated circuit device having an SRAM. Hereinafter, however, a semiconductor integrated circuit of an SRAM will be mainly described, and it is simply referred to as SRAM.

A test method of an SRAM according to a typical embodiment has a feature in that a control period of the threshold voltage of a transfer MOS transistor, in which a word line voltage is controlled, is disposed before a test operation and thereafter a read operation or a write operation of the SRAM is performed. Moreover, a word line driver circuit according to a typical embodiment can selectively render transistors, which are connected respectively to power supplies of an operation voltage and a word line control voltage, conductive to thereby control a word line voltage.

That is, in the test method of the SRAM according to the embodiment, in the SRAM having a plurality of memory cells (104) and a control circuit (101 and 102) that controls the plurality of memory cells, a preparation period in which a word line voltage is controlled is disposed before a write operation or a read operation of the memory cell, whereby a malfunctioning cell of the SRAM due to a temporal threshold voltage fluctuation is detected.

The memory cell includes two transfer MOS transistors (mt1 and mt2), two load MOS transistors (ml1 and ml2), and two driver MOS transistors (md1 and md2). The word line is connected to gate terminals of the two transfer MOS transistors.

The control circuit includes a test/normal operation selection circuit (101) and a word line driver circuit (102). At the time of a write test of the memory cell, the control circuit applies a third voltage (VDDH) to a word line in a preparation period before writing test data, thereafter a first voltage (VDD) to the word line, and a second voltage (GND) to the word line at the end of writing.

At the time of a read test of the memory cell, the control circuit applies the second voltage (GND) to a word line in a preparation period before reading test data, thereafter the first voltage (VDD) to the word line, and the second voltage (GND) to the word line at the end of reading.

The word line driver circuit includes a logic circuit (403) and a drive circuit (404). The drive circuit includes first and second PMOS transistors (MP1 and MP2) and an NMOS transistor (MN1). An output of the logic circuit is connected to gates of the first and second PMOS transistors and the NMOS transistor. In a test mode, the first voltage (VDD) is connected to the first PMOS transistor, and the third voltage (VDDH) is connected to the second PMOS transistor. In a normal operation mode, the first voltage and the second voltage of the drive circuit are connected inside or outside an integrated circuit.

The logic circuit outputs, in the test mode, a signal that selectively renders the first and second PMOS transistors conductive, and in the normal operation mode, a signal that simultaneously renders the first and second PMOS transistors conductive or cut-off.

At the time of a normal operation, a terminal of the first voltage of the drive circuit is connected to the second voltage.

Next, more specific contents of a test method and circuit of an SRAM including these configurations will be described in detail in the following embodiments.

Embodiment 1

Embodiment 1 will be described with reference to FIGS. 1 to 15.

<Test Circuit of SRAM>

FIG. 1 is a block diagram showing a configuration example of a test method and circuit of an SRAM according to Embodiment 1. The test circuit of the SRAM shown in FIG. 1 includes a test/normal operation selection circuit (CTL) 101, a word line driver circuit (WD) 102, a memory cell array (MCA) 103, and a sense amplifier circuit (SA) 105. The test/normal operation selection circuit 101 is connected to the word line driver circuit 102. The word line driver circuit 102 and the sense amplifier circuit 105 are connected to the memory cell array 103.

The test/normal operation selection circuit 101 outputs a signal. TEST (for example, in the case of 'H' a test operation mode is specified, while in the case of 'L', a normal operation mode is specified) that specifies the operation mode between the test operation and the normal operation. Moreover, the test/normal operation selection circuit 101 outputs, in each of the operation modes, a signal MODE (for example, in the case of 'H', the write operation is specified, while in the case of 'L', the read operation is specified) that specifies the read operation or the write operation. 'H' indicates a high level of a digital signal, while 'L' indicates a low level.

The word line driver circuit 102 is a circuit that drives word lines (WDL) connected to the memory cell array 103. The word line driver circuit 102 performs voltage control of the word lines according to the operation mode and the read/write operation specified by the test/normal operation selection circuit 101.

The memory cell array 103 includes a plurality of memory cells (MC) 104 arranged in two dimensions. To each of the memory cells 104, the word line and two bit lines (BTL and BTLN) are connected. BTL and BTLN are differential signals. The word line controls the turn-on and turn-off of a transfer MOS transistor, which will be described later, in the memory cell 104. The bit lines are connected to the sense amplifier circuit 105.

The sense amplifier circuit 105 detects a change in voltage of the bit lines at the time of the read operation to thereby read information of each of the memory cells 104. The word line and the bit lines are common to each of rows or columns in the memory cell array 103. The word line selects a memory cell in a vertical direction in FIG. 1, and the bit lines specify a sense amplifier to be read to select a memory cell in a horizontal direction in FIG. 1. Due to this, a memory cell to be operated is selected.

<Variation Characteristic of RTN>

Figure 2:
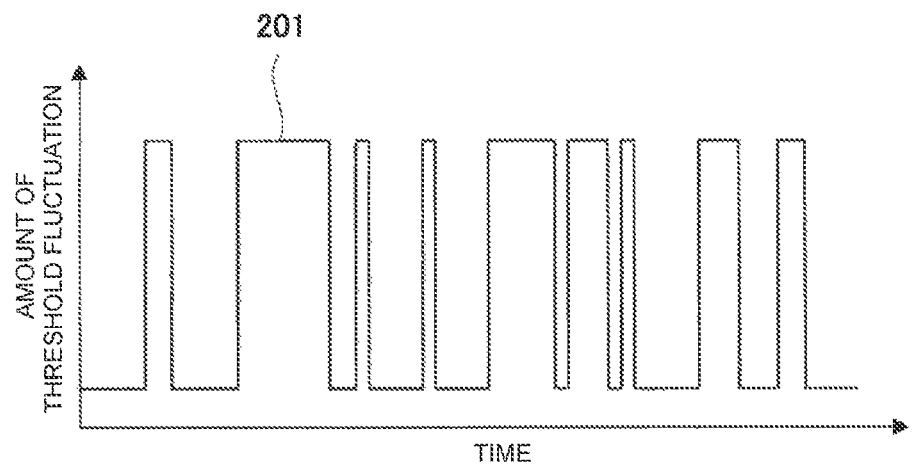
FIG. 2 is a schematic diagram showing a general RTN variation characteristic example.

Before describing in detail Embodiment 1, a variation called random telegraph noise (RTN), which is one type of temporally fluctuating variation that the invention is intended to solve, will be described. FIG. 2 is a schematic diagram (horizontal axis: time, vertical axis: amount of threshold fluctuation) showing a general RTN variation characteristic example (RTN variation characteristic 201).

Transistor variations in the past are attributable to processing accuracy, and they are determined when a device is produced. The threshold voltage of a transistor does not change with time.

On the other hand, RTN as a target in the invention is a phenomenon in which the transistor threshold voltage temporally fluctuates, like the RTN variation characteristic 201 shown in FIG. 2, due to carriers being captured or released at a small structural defect at an atomic level present in a gate oxide film of a MOS transistor. The temporal fluctuation characteristic of the threshold voltage has a random characteristic. However, it is known that the characteristic depends on a voltage applied to a gate terminal of the transistor and an operation temperature. In the gate voltage characteristic of RTN in general, a high threshold voltage state (hereinafter referred to as high Vth) is likely to appear when the gate voltage is increased, while a low threshold voltage state (hereinafter referred to as low Vth) is likely to appear when the gate voltage is lowered. Moreover, it is also known, regarding the gate voltage characteristic of RTN, that when the gate voltage is changed, the temporal characteristic of the threshold voltage fluctuation right after changing the gate voltage is the same temporal characteristic as it was before changing the gate voltage.

<Configuration of Memory Cell and Operation Error of SRAM>

Figure 3:
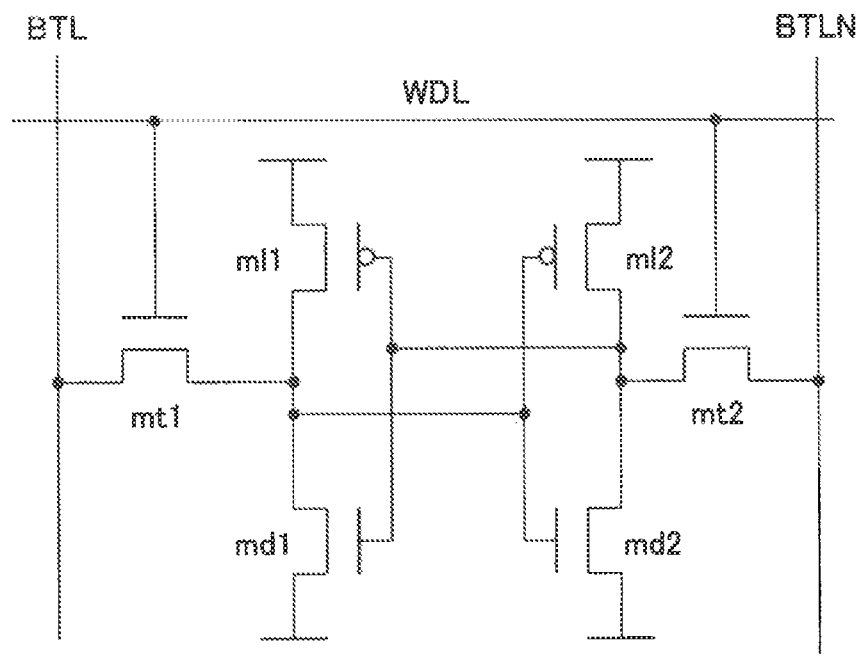
FIG. 3 is a circuit diagram showing a configuration example of a memory cell of the SRAM in Embodiment 1 of the invention.

FIG. 3 is a circuit diagram showing a configuration example of the memory cell 104 of the SRAM. The memory cell 104 includes six transistors. The memory cell 104 includes two loop-connected inverter circuits composed of load MOS transistors (ml1 and ml2) and driver MOS transistors (md1 and md2), and transfer MOS transistors (mt1 and mt2) inserted between the inverter circuits and the bit lines (BTL and BTLN). The word line (WDL) is connected to gate terminals of the transfer MOS transistors. The memory cell 104 performs the read operation and the write operation via the transfer MOS transistors.

Next, a relation between a threshold voltage variation of the transistor and an operation error of the SRAM will be described. The memory cell 104 of the SRAM including the six transistors (ml1, ml2, md1, md2, mt1, and mt2) is generally most sensitive to variations of the transfer MOS transistors (mt1 and mt2). This is because a signal transmits through the transfer MOS transistor at the time of both the read operation and the write operation and threshold voltage conditions required for the transfer MOS transistor are inverted in characteristics between the read operation and the write operation. In the read operation of the SRAM, an operation error occurs as the threshold voltage of the transfer MOS transistor is lowered. In the write operation, on the other hand, an operation error occurs as the threshold voltage of the transfer MOS transistor is increased. Hence, the transfer MOS transistor is sensitive to the variation because it is necessary for the transfer MOS transistor to be designed with threshold voltage conditions that satisfy both the read operation and the write operation and therefore, an allowable range of the threshold voltage fluctuation is narrow.

<Configuration of Word Line Driver Circuit>

Figure 4:
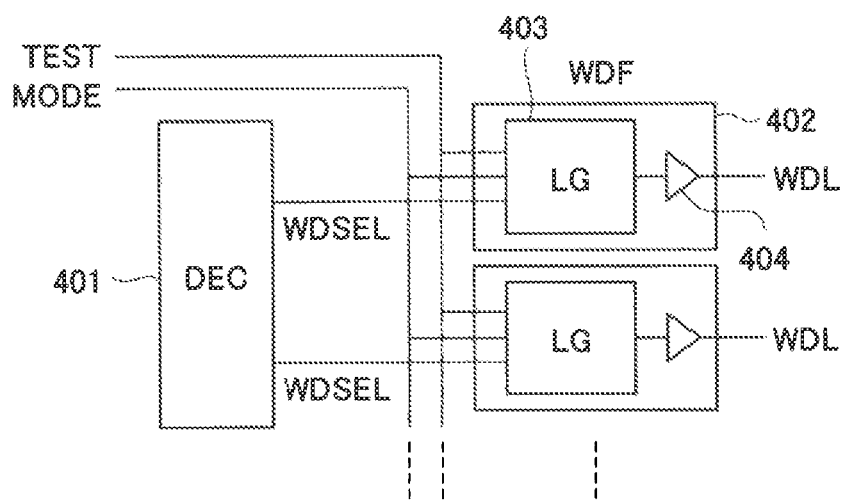
FIG. 4 is a block diagram showing a configuration example of a word line driver circuit in Embodiment 1 of the invention.

FIG. 4 is a block diagram showing a configuration example of the word line driver circuit 102. The word line driver circuit 102 includes a decoder (DEC) 401 that generates address signals of the word lines (WDL) and word line output circuits (WDF) 402 that drive the word lines. As many word line output circuits 402 as the number of word lines of the memory cell array 103 are prepared.

The decoder 401 sets a word line address signal WDSEL corresponding to a specified address to 'H' level and sets the other word line address signals to 'L'. The word line output circuit 402 includes a test/normal operation switching logic circuit (LG) 403 and a drive circuit 404. To the test/normal operation switching logic circuit 403, the signal TEST, the signal MODE, and the signal. WDSEL are input. The drive circuit 404 performs word line driving according to the operation mode specified by the signals of TEST and MODE when WDSEL is 'H'. When WDSEL is 'L', the drive circuit 404 sets the word line to 'L'.

<Configuration of Word Line Output Circuit>

Figure 5:
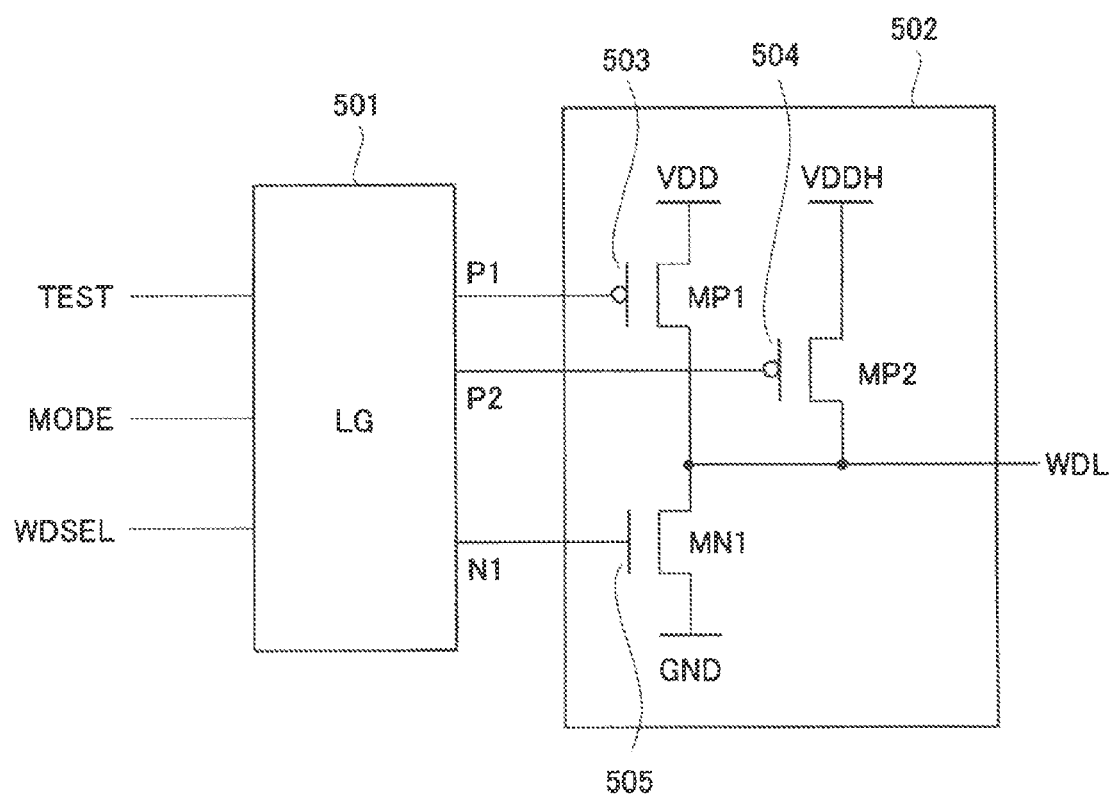
FIG. 5 is a circuit diagram showing a configuration example of a word line output circuit in Embodiment 1 of the invention.

FIG. 5 is a circuit diagram showing a configuration example of the word line output circuit 402. The word line output circuit 402 can switch three voltages to output to the word line (WDL). The word line output circuit 402 includes a test/normal operation switching logic circuit (LG) 501 and a drive circuit 502. The test/normal operation switching logic circuit 501 corresponds to one test/normal operation switching logic circuit 403 shown in FIG. 4. The drive circuit 502 corresponds to one drive circuit 404 shown in FIG. 4.

The signals TEST, MODE, and WDSEL are input to the test/normal operation switching logic circuit 501, and the test/normal operation switching logic circuit 501 outputs control signals P1, P2, and N1 of the drive circuit 502. The drive circuit 502 includes two PMOS transistors 503 and 504 and one NMOS transistor 505. Source terminals of the PMOS transistors 503 and 504 and the NMOS transistor 505 are respectively connected to the first voltage (VDD), the third voltage (VDDH), and the second voltage (GND). VDDH has a voltage level higher than that of VDD, and VDD has a voltage level higher than that of GND. The signals P1, P2, and N1 are respectively connected to gate terminals of the transistors 503, 504, and 505. Drain terminals of the transistors 503, 504, and 505 are connected in common to the word line (WDL). Operation of the word line output circuit 402 will be described later.

<Operation of Test Circuit of SRAM>

Hereinafter, operation of the test circuit of the SRAM according to Embodiment 1 will be described.

<<At Time of Write Operation in Test Mode>>

Figure 6:
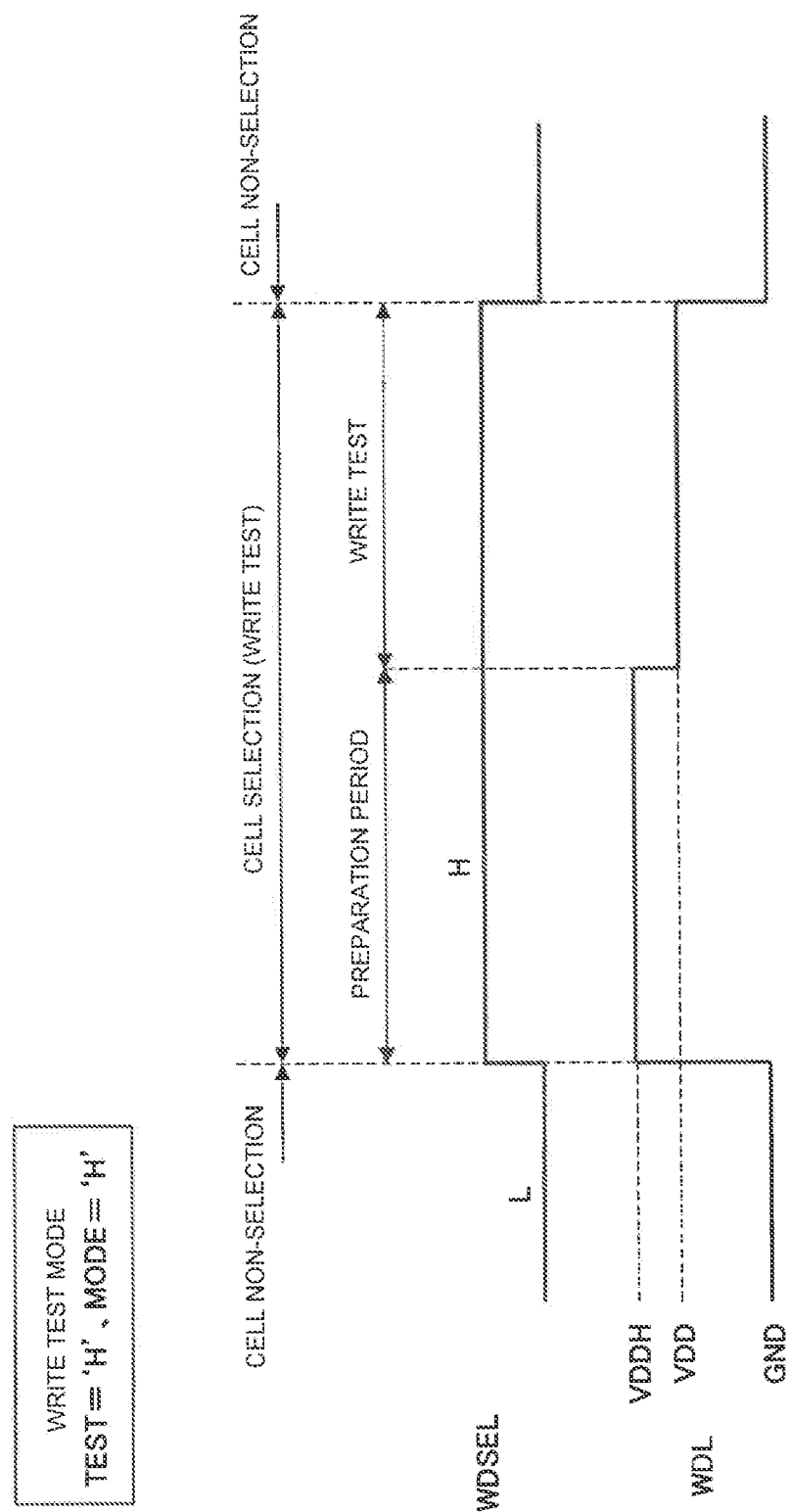
FIG. 6 shows a voltage waveform example of a word line at the time of a write operation in a test mode in Embodiment 1 of the invention.

FIG. 6 shows a voltage waveform example of the word line WDL at the time of the write operation in the test mode (TEST='H' and MODE='H'). When the word line is not selected (cell non-selection and WDSEL='L'), WDL outputs the second voltage (GND) as a ground potential. When the word line is selected (cell selection and WDSEL='H') WDL outputs 'H'. However, this 'H' period of WDL is divided into a preparation period and a write test time, and a voltage value at which the word line is driven is changed in each of the periods.

In the write operation in the test mode, the preparation period in which the threshold voltage of the transfer MOS transistor is controlled is disposed before performing the write operation. As described above, in the write operation of the SRAM, an operation error is likely to occur as the threshold voltage of the transfer MOS transistor is increased. Therefore, a word line voltage is increased to the third voltage (VDDH) in this preparation period. Due to this, the probability in which the threshold voltage of the word line is in a high Vth state is increased. After this, the voltage of WDL is lowered to the first voltage (VDD) as a standard voltage of a circuit operation to perform the write operation, so that a write test is performed. With this series of word line voltage control operations, since the probability in which the write operation is executed with the temporally fluctuating threshold voltage of the transfer MOS transistor being in the high Vth state is increased, the efficiency of detecting a write operation error can be increased.

<<At Time of Read Operation in Test Mode>>

Figure 7:
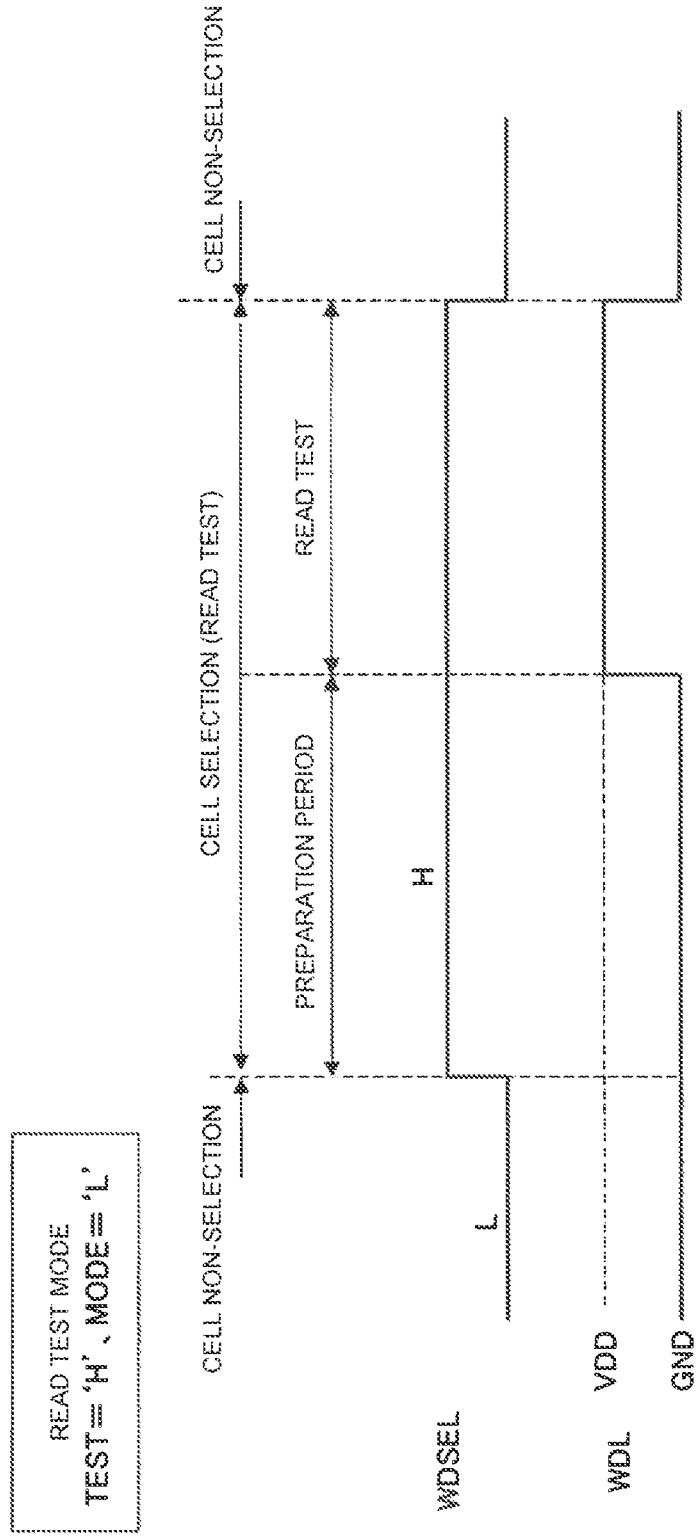
FIG. 7 shows a voltage waveform example of the word line at the time of a read operation in the test mode in Embodiment 1 of the invention.

FIG. 7 shows a voltage waveform example of the word line WDL at the time of the read operation in the test mode (TEST='H' and MODE='L'). Similarly to the write operation in the test mode shown in FIG. 6, when the word line is not selected (cell non-selection and WDSEL='L'), WDL outputs the second voltage (GND) as a ground potential. When the word line is selected (cell selection and WDSEL='H'), the 'H' period of the word line is divided into a preparation period and a read test time similarly to the write operation.

The word line output circuit 402 outputs 'L' (the second voltage GND) to WDL in the preparation period and 'H' (the first voltage VDD) at the time of the read test. As described above, in the read operation of the SRAM, an operation error is likely to occur as the threshold voltage of the transfer MOS transistor is lowered. Therefore, a word line voltage is lowered to the second voltage (GND) in the preparation period. Due to this, the threshold voltage of the word line is brought into a state where a low Vth state is likely to appear. After this, the voltage of WDL is increased to the first voltage (VDD) as the standard voltage of the circuit operation to perform the read operation, so that the read test is implemented.

<<At Time of Write Operation or Read Operation in Normal Operation Mode>>

Figure 8:
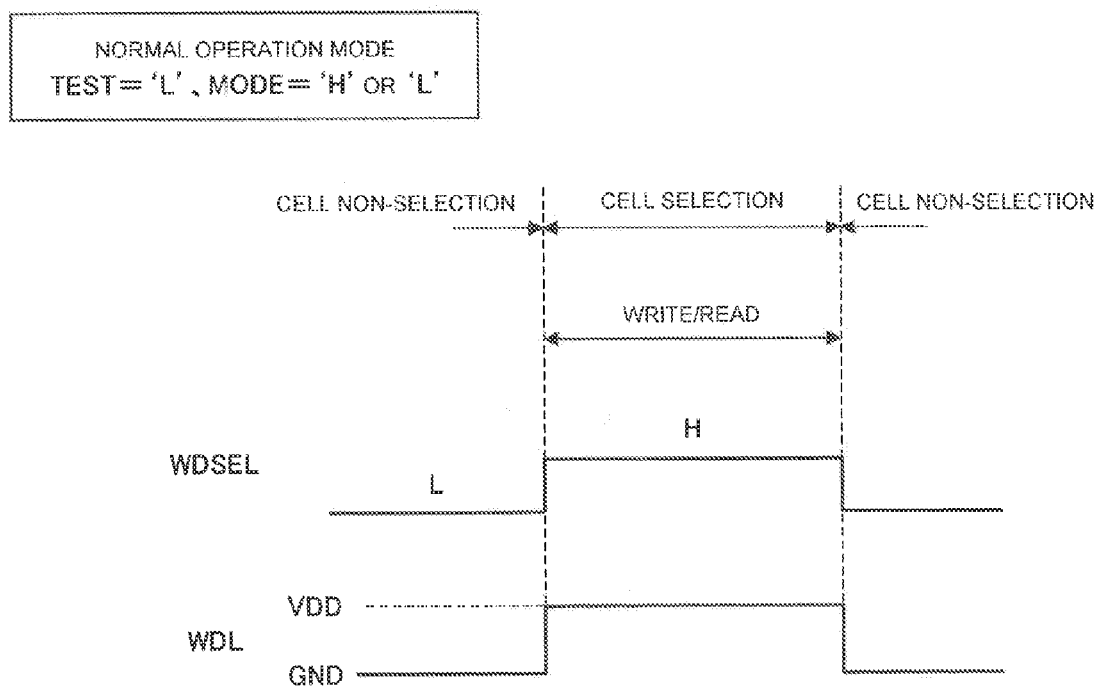
FIG. 8 shows a voltage waveform example of the word line at the time of a write operation or a read operation in a normal operation mode in Embodiment 1 of the invention.

FIG. 8 shows a voltage waveform example of the word line at the time of the write operation or the read operation in the normal operation mode (TEST='L' and MODE='H' or 'L'). In the normal operation mode, a preparation period is not disposed in the 'H' period of the word line. When the word line is not selected (cell non-selection and WDSEL 'L'), WDL outputs the second voltage (GND) as a ground potential. When the word line is selected (cell selection and WDSEL='H'), WDL is set to the first voltage (VDD) regardless of the read operation or the write operation. Then, the write operation or the read operation according to the MODE signal is performed.

<<Operation of Word Line Output Circuit at Time of Write Test>>

Figure 9:
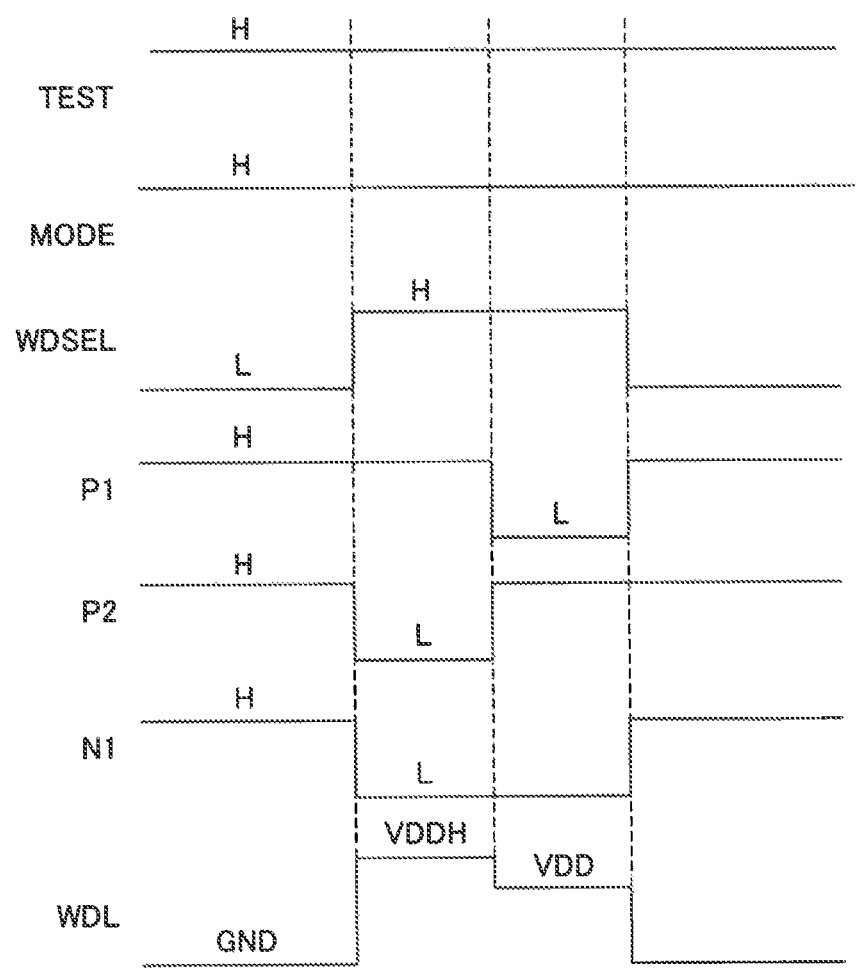
FIG. 9 shows a voltage waveform example of operation of the word line output circuit at the time of a write test in Embodiment 1 of the invention.

FIG. 9 shows a voltage waveform example of operation of the word line output circuit 402 at the time of a write test (TEST='H' and MODE='H'). In a non-selection period (WDSEL='L') of the word line, the test/normal operation switching logic circuit 501 outputs P1='H', P2='H', and N1='H' to render the NMOS transistor 505 of the drive circuit 502 conductive, so that the second voltage (GND) is output to the word line WDL.

In the preparation period of the selection period (WDSEL='H') of the word line, the test/normal operation switching logic circuit 501 outputs P1='H', P2='L', and N1='L' to render the PMOS transistor 504 of the drive circuit 502 conductive, so that the third voltage (VDDH) is output to the word line WDL. In the write operation period of the selection period (WDSEL='H') of the word line, the test/normal operation switching logic circuit 501 outputs P1='L', P2='H', and N1='L' to render the PMOS transistor 503 of the drive circuit 502 conductive, so that the first voltage (VDD) is output to the word line WDL.

With the above control, at the time of the write test, a word line voltage can be controlled to be the third voltage (VDDH) in the preparation period and to be the first voltage (VDD) in the write operation period. Accordingly, the write operation can be performed with the transfer MOS transistor being under threshold voltage conditions where a write operation error is likely to occur.

<<Operation of Word Line Output Circuit at Time of Read Test>>

Figure 10:
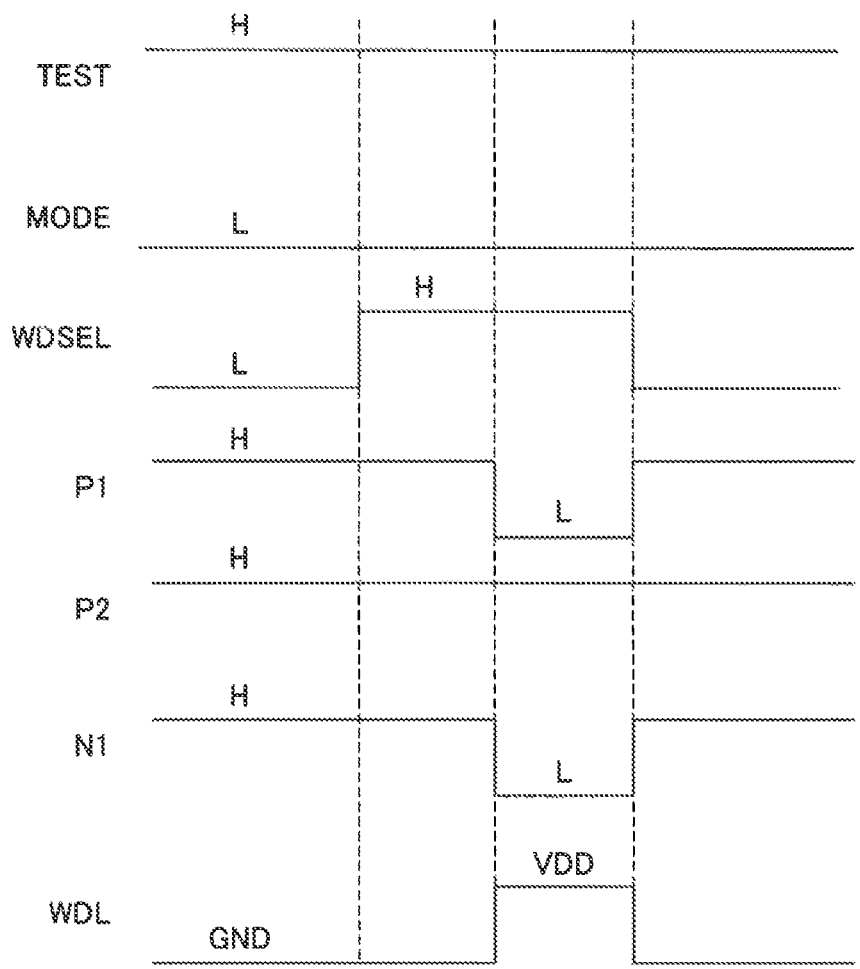
FIG. 10 shows a voltage waveform example of operation of the word line output circuit at the time of a read test in Embodiment 1 of the invention.

FIG. 10 shows a voltage waveform example of operation of the word line output circuit 402 at the time of a read test (TEST='H' and MODE='L'). In the non-selection period (WDSEL='L') of the word line, the test/normal operation switching logic circuit 501 outputs P1='H', P2='H', and N1='H' to render the NMOS transistor 505 of the drive circuit 502 conductive, so that the second voltage (GND) is output to the word line WDL.

In the preparation period of the selection period (WDSEL='H') of the word line, the test/normal operation switching logic circuit 501 outputs, similarly to the word line non-selection period, P1='H', P2='H', and N1='H' to render the NMOS transistor 505 of the drive circuit 502 conductive, so that the second voltage (GND) is output to the word line WDL. In the read operation period of the selection period (WDSEL='H') of the word line, the test/normal operation switching logic circuit 501 outputs P1='L', P2='H', and N1='L' to render the PMOS transistor 503 of the drive circuit 502 conductive, so that the first voltage (VDD) is output to the word line WDL.

With the above control, at the time of the read test, a word line voltage can be controlled to be the second voltage (GND) in the preparation period and to be the first voltage (VDD) in the read operation period. Accordingly, the read operation can be performed with the transfer MOS transistor being under threshold voltage conditions where a read operation error is likely to occur.

<<Operation of Word Line Output Circuit at Time of Normal Operation>>

Figure 11:
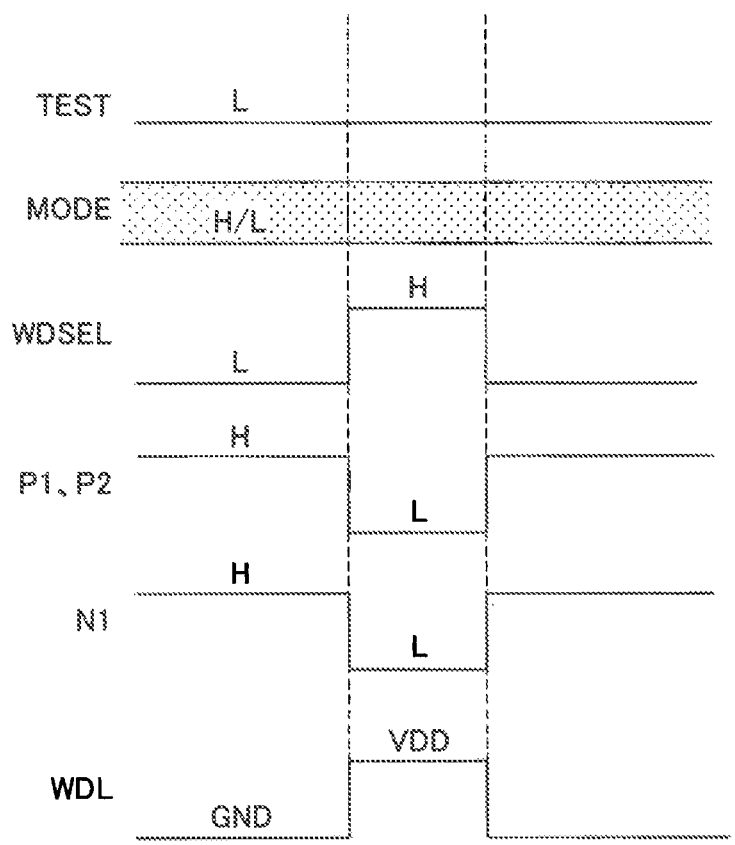
FIG. 11 shows a voltage waveform example of operation of the word line output circuit at the time of a normal operation in Embodiment 1 of the invention.

FIG. 11 shows a voltage waveform example of operation of the word line output circuit 402 at the time of a normal operation (TEST='L' and MODE='H' or MODE='L'). As described above, at the time of the normal operation, a voltage VDD terminal and a voltage VDDH terminal are short-circuited outside or inside a semiconductor integrated circuit, so that the power supply terminal is connected to VDD.

In the non-selection period (WDSEL='L') of the word line, the test/normal operation switching logic circuit 501 outputs P1='H', P2='H', and N1='H' to render the NMOS transistor 505 of the drive circuit 502 conductive, so that the second voltage (GND) is output to the word line WDL. In the selection period (WDSEL='H') of the word line, the test/normal operation switching logic circuit 501 sets P1='L', P2='L', and N1='L' regardless of the read operation or the write operation, so that the first voltage (VDD) is output to the word line WDL.

With the above control, word line voltage control (two-voltage driving of the voltages VDD and GND) for the normal operation mode is possible. Further in the method, since the PMOS transistors 503 and 504 used for voltage switching switches at the time of a test are used as PMOS transistors of the same operation, an overhead such as an increase in area can be minimized.

<Effect of Embodiment 1>

According to Embodiment 1 as described above, the drive voltage of the word line (WDL) is changed in the test mode and in the operation mode. In the test mode, the preparation period in which a threshold voltage is controlled is disposed before performing the read operation or the write operation, and a word line voltage is controlled.

That is, the memory cell 104 has the transfer MOS transistors (mt1 and mt2) whose gates are connected to a word line. At the time of the write test of the memory cell 104, the control circuit including the test/normal operation selection circuit 101 and the word line driver circuit 102 can apply the third voltage (VDDH) to the word line in the preparation period before writing test data, thereafter the first voltage (VDD) to the word line, and the second voltage (GND) to the word line at the end of writing. Moreover, at the time of the read test of the memory cell 104, the control circuit can apply the second voltage (GND) to the word line in the preparation period before reading test data, thereafter the first voltage (VDD) to the word line, and the second voltage (GND) to the word line at the end of reading.

In this case, in the drive circuit 502 is the word line driver circuit 102, the first voltage (VDD) can be connected to the first PMOS transistor 503, and the third voltage (VDDH) can be connected to the second PMOS transistor 504. The test/normal operation switching logic circuit 501 can output, in the test mode, a signal that selectively renders the first PMOS transistor 503 and the second PMOS transistor 504 conductive, and in the normal operation mode, a signal that simultaneously renders the first PMOS transistor 503 and the second PMOS transistor 504 conductive or cut-off. The drive circuit 502 can be short-circuited between the first voltage (VDD) and the third voltage (VDDH) in the normal operation mode.

With the above configuration, since the threshold voltage of the transfer MOS transistor, which fluctuates with time, can be controlled, detection efficiency for a malfunctioning cell of the SRAM due to a temporal variation can be enhanced. In other words, it is possible to detect an operation error of the SRAM caused by a device variation that fluctuates with time (temporally fluctuates).

Modified Example of Embodiment 1

Next, a modified example of Embodiment 1 will be described. Descriptions of configurations and operations similar to those of Embodiment 1 described above are omitted. In the modified example, in the preparation period at the time of the read test operation, a word line voltage is set not to the second voltage (GND) but to a fourth voltage (GNDL) having a voltage level lower than that of GND, so that detection efficiency for an SRAM malfunctioning cell is further enhanced.

<<Configuration of Word Line Output Circuit as Modified Example>>

Figure 12:
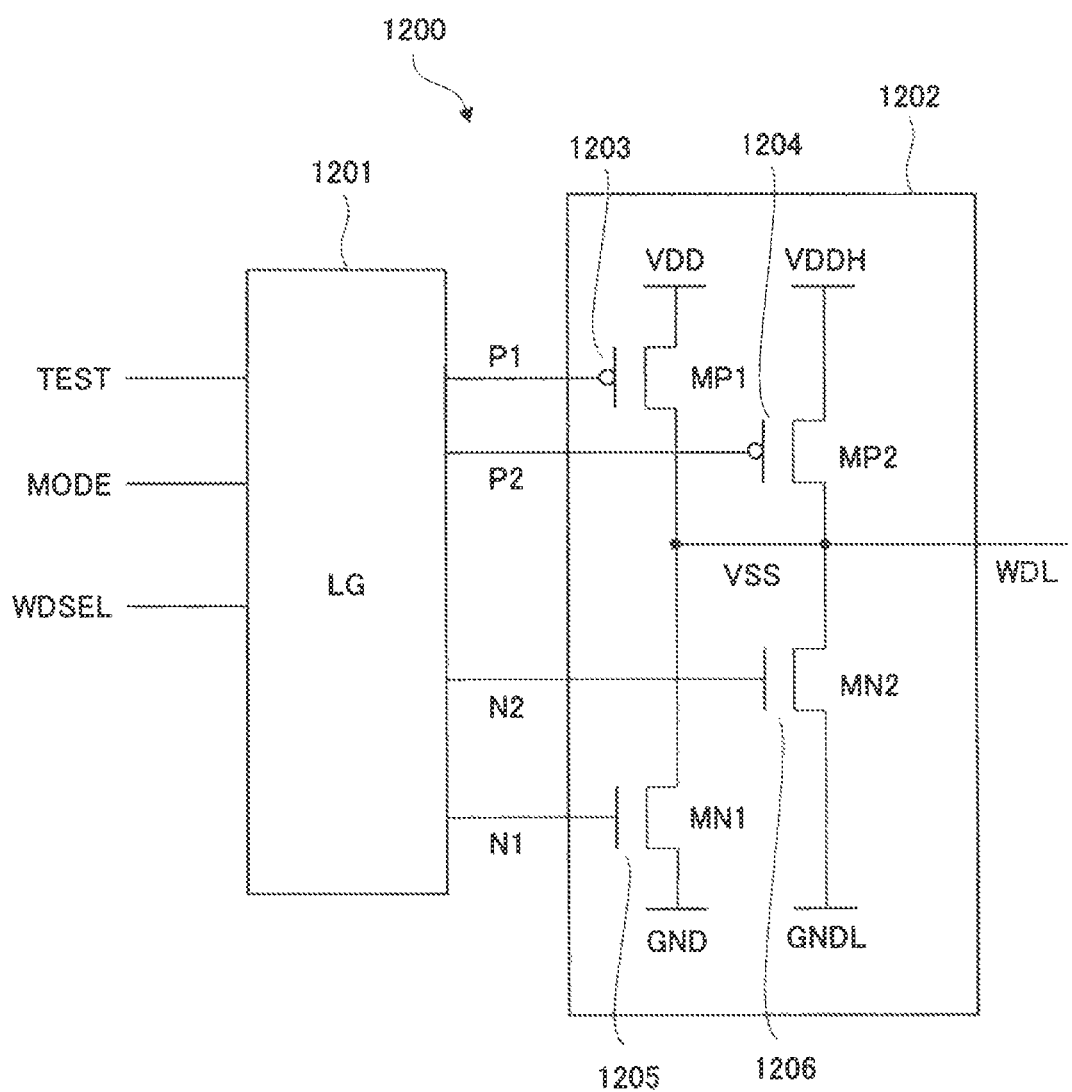
FIG. 12 is a circuit diagram showing a configuration example of a word line output circuit as a modified example in Embodiment 1 of the invention.

FIG. 12 is a circuit diagram showing a configuration example of a word line output circuit 1200 as the modified example. The word line output circuit 1200 can switch four voltage values to output to the word line (WDL). The word line output circuit 1200 includes a test/normal operation switching logic circuit (LG) 1201 and a drive circuit 1202.

The signals TEST, MODE, and WDSEL are input to the test/normal operation switching logic circuit 1201, and the test/normal operation switching logic circuit 1201 outputs control signals P1, P2, N1, and N2 of the drive circuit 1202. The drive circuit 1202 includes two PMOS transistors (MP1) 1203 and (MP2) 1204 and two NMOS transistors (MN1) 1205 and (MN2) 1206. Source terminals of the PMOS transistors 1203 and 1204 and the NMOS transistors 1205 and 1206 are respectively connected to the first voltage (VDD), the third voltage (VDDH), the second voltage (GND), and the fourth voltage (GNDL). The signals P1, P2, N1, and N2 are respectively connected to gate terminals of the transistors 1203, 1204, 1205, and 1206. Drain terminals of the transistors 1203, 1204, 1205, and 1206 are connected in common to the word line (WDL).

<<Operation of Word Line Output Circuit at Time of Write Test as Modified Example>>

Figure 13:
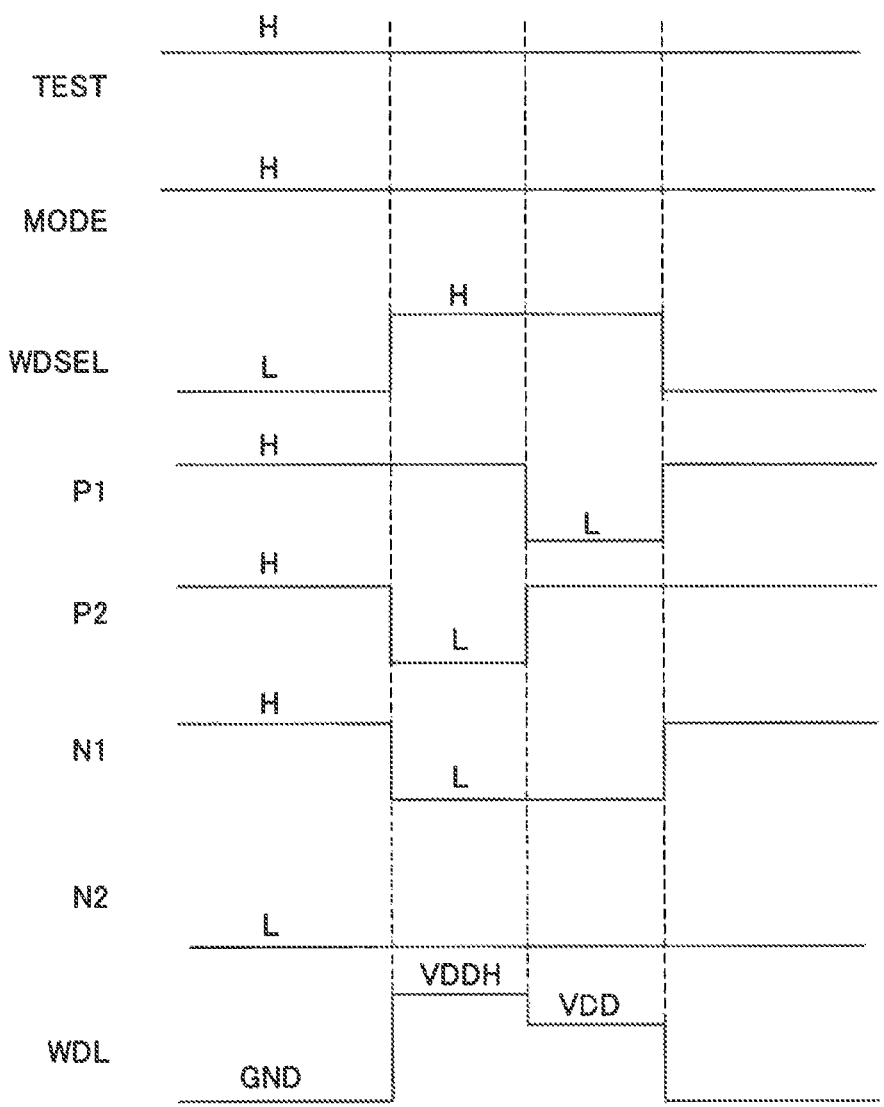
FIG. 13 shows a voltage waveform example of operation of the word line output circuit at the time of a write test as the modified example in Embodiment 1 of the invention.

FIG. 13 shows a voltage waveform example of operation of the word line output circuit 1200 at the time of a write test as the modified example. In the non-selection period (WDSEL='L') of the word line, the test/normal operation switching logic circuit 1201 outputs P1='H', P2='H' N1='H', and N2='L' to render the NMOS transistor 1205 of the drive circuit 1202 conductive, so that the second voltage (GND) is output to the word line WDL.

In the preparation period of the selection period (WDSEL='H') of the word line, the test/normal operation switching logic circuit 1201 outputs P1='H', P2='L', N1='L', and N2='L' to render the PMOS transistor 1204 of the drive circuit 1202 conductive, so that the third voltage (VDDH) is output to the word line WDL. In the write operation period of the selection period (WDSEL='H') of the word line, the test/normal operation switching logic circuit 1201 outputs P1='L', P2='H', N1='L', and N2='L' to render the PMOS transistor 1203 of the drive circuit 1202 conductive, so that the first voltage (VDD) is output to the word line WDL.

With the above control, at the time of the write test, a word line voltage can be controlled to be the third voltage (VDDH) in the preparation period and to be the first voltage (VDD) in the write operation period. Accordingly, the write operation can be performed with the threshold voltage of the transfer MOS transistor being under high threshold voltage conditions where the occurrence probability of a write operation error is increased.

<<Operation of Word Line Output Circuit at Time of Read Test as Modified Example>>

Figure 14:
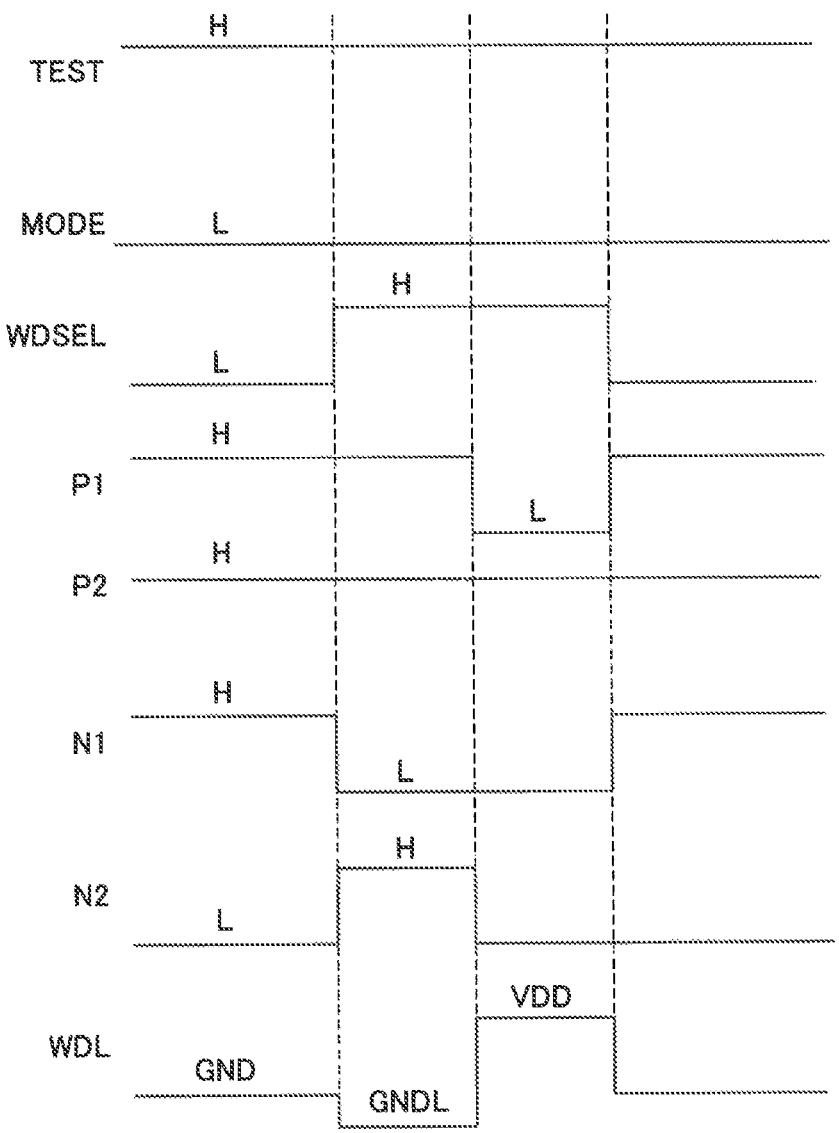
FIG. 14 shows a voltage waveform example of operation of the word line output circuit at the time of a read test as the modified example in Embodiment 1 of the invention.

FIG. 14 shows a voltage waveform example of operation of the word line output circuit 1200 at the time of a read test as the modified example. In the non-selection period (WDSEL='L') of the word line, the test/normal operation switching logic circuit 1201 outputs P1='H', P2='H', N1='H', and N2='L' to render the NMOS transistor 1205 of the drive circuit 1202 conductive, so that the second voltage (GND) is output to the word line WDL.

In the preparation period of the selection period (WDSEL='H') of the word line, the test/normal operation switching logic circuit 1201 outputs P1='H', P2='H', N1='L', and N2='H' to render the NMOS transistor 1206 of the drive circuit 1202 conductive, so that the fourth voltage (GNDL) is output to the word line WDL. In the operation period of the selection period (WDSEL='H') of the word line, the test/normal operation switching logic circuit 1201 outputs P1='L', P2='H', N1='L', and N2='L' to render the PMOS transistor 1203 of the drive circuit 1202 conductive, so that the first voltage (VDD) is output to the word line WDL.

With the above control, at the time of the read test, a word line voltage can be controlled to be the fourth voltage (GNDL) in the preparation period and to be the first voltage (VDD) in the read operation period. Accordingly, the read operation can be performed with the transfer MOS transistor being under low threshold voltage conditions where the occurrence probability of a read operation error is increased.

<<Operation of Word Line Output Circuit at Time of Normal Operation as Modified Example>>

Figure 15:
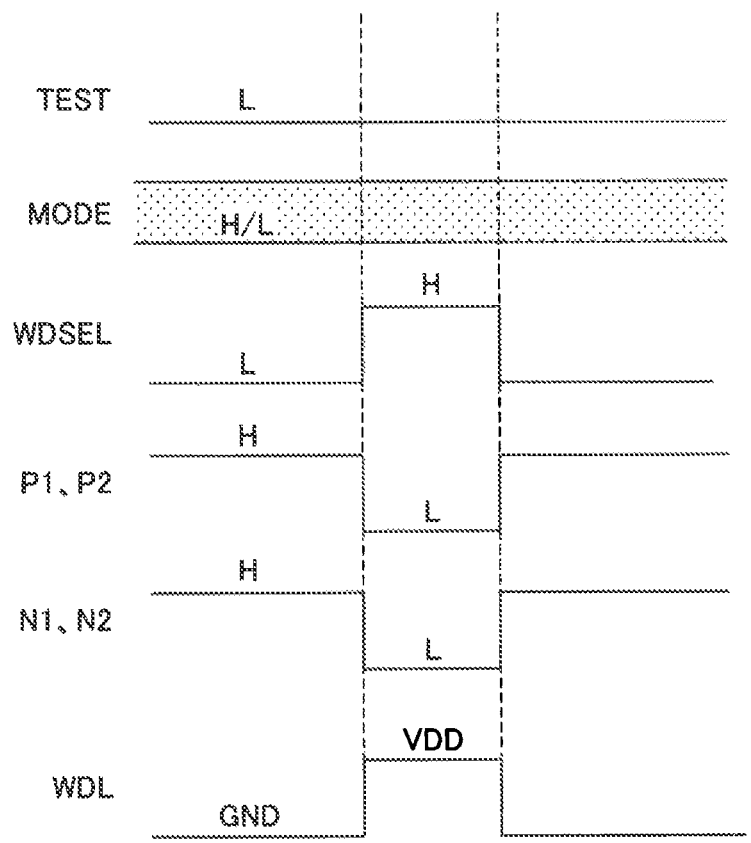
FIG. 15 shows a voltage waveform example of operation of the word line output circuit at the time of a normal operation as the modified example in Embodiment 1 of the invention.

FIG. 15 shows a voltage waveform example of operation of the word line output circuit 1200 at the time of the normal operation as the modified example. At the time of the normal operation, a voltage VDD terminal and a voltage VDDH terminal are previously rendered conductive to be connected to VDD outside or inside an LSI. Moreover, a voltage GND terminal and a voltage GNDL terminal are rendered conductive to be connected to GND.

In the non-selection period (WDSEL='L') of the word line, the test/normal operation switching logic circuit 1201 outputs P1='H', P2='H', N1='H', and N2='H' to render the NMOS transistor 1205 of the drive circuit 1202 conductive, so that the second voltage (GND) is output to the word line WDL. In the selection period (WDSEL='H') of the word line, the test/normal operation switching logic circuit 1201 sets P1='L', P2='L', N1='L', and N2='L' regardless of the read operation or the write operation, so that the first voltage (VDD) is output to the word line.

With the above control, word line voltage control of the voltages VDD and GND for the normal operation is possible. Further in the method, the PMOS transistors 1203 and 1204 used for voltage switching switches at the time of a test are used as the same PMOS transistor, and the NMOS transistors 1205 and 1206 are used as the same NMOS transistor. Therefore, an overhead such as an increase in area can be reduced.

<<Effect of Modified Example>>

According to the modified example of Embodiment 1 as described above, the drive voltage of the word line is changed in the test mode and in the operation mode. In the test mode, the preparation period is disposed before the read operation or the write operation, and a word line voltage is controlled. Due to this, since a threshold voltage fluctuation characteristic of the transfer MOS transistor can be controlled, detection efficiency for a malfunctioning cell of the SRAM due to a temporal variation can be enhanced. Particularly in the preparation period at the time of the read test operation, a word line voltage is set to the fourth voltage (GNDL) lower than the second voltage (GND), so that detection efficiency for a malfunctioning cell of the SRAM can be further enhanced.

Embodiment 2

Embodiment 2 will be described with reference to FIGS. 16 to 18.

<Test Circuit of SRAM>

Figure 16:
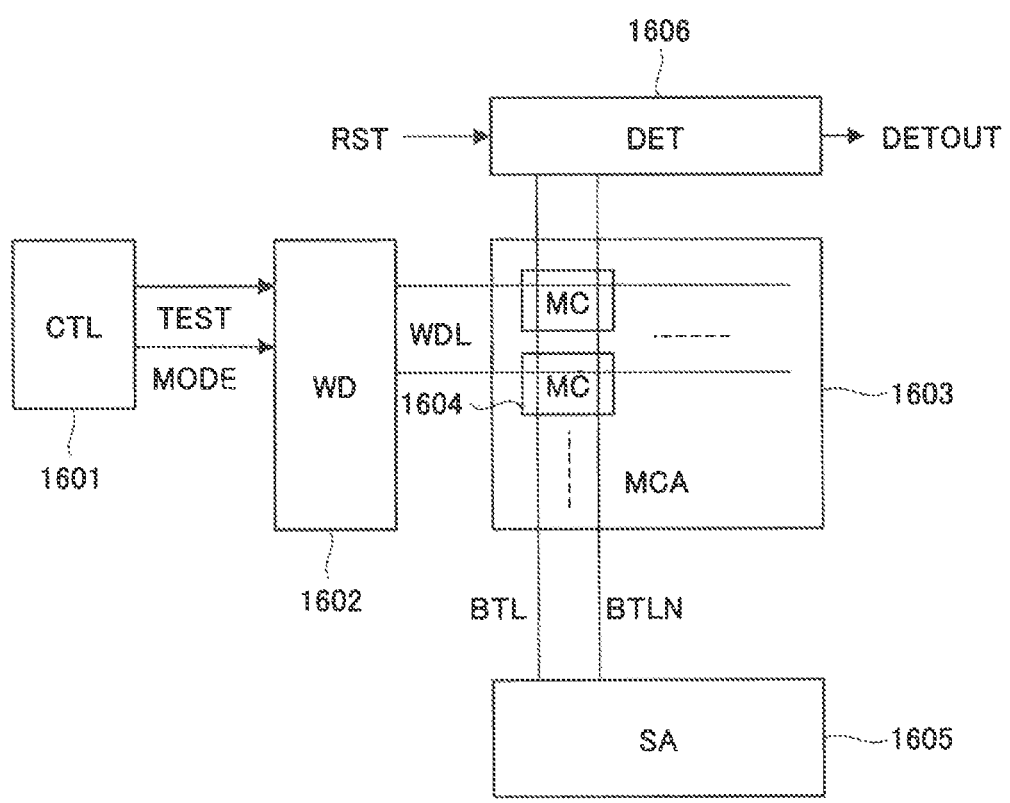
FIG. 16 is a block diagram showing a configuration example of a test method and circuit of an SRAM according to Embodiment 2 of the invention.

FIG. 16 is a block diagram showing a configuration example of a test method and circuit of an SRAM according to Embodiment 2. The test circuit of the SRAM shown in FIG. 16 includes a test/normal operation selection circuit (CTL) 1601, a word line driver circuit (WD) 1602, a memory cell array (MCA) 1603, a sense amplifier circuit (SA) 1605, and a bit line current detection circuit (DET) 1606. Configurations of the blocks excepting the bit line current detection circuit 1606 are similar to those of Embodiment 1 shown in FIG. 1, and therefore the descriptions thereof are omitted. In the following, differences from Embodiment 1 will be mainly described.

The bit line current detection circuit 1606 is connected to bit lines BTL and BTLN of memory cells (MC) 1604. The bit line current detection circuit 1606 detects, when the word line WDL is driven to 'H', a fluctuation in the bit line operation current of the memory cell 1604 selected, and outputs a detection result DETOUT of the fluctuation. To the bit line current detection circuit 1606, a reset signal RST is input.

<Configuration of Bit Line Current Detection Circuit>

Figure 17:
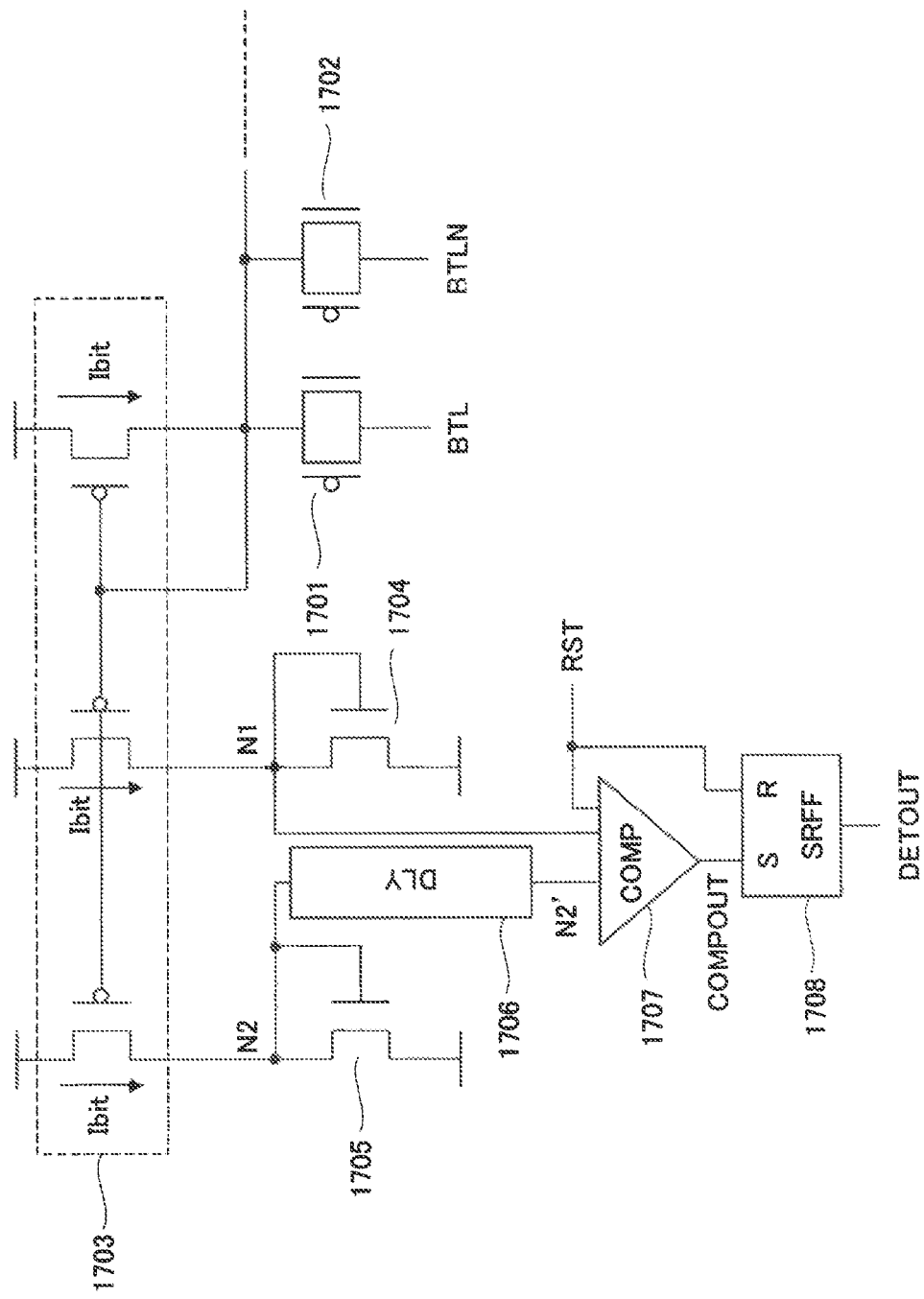
FIG. 17 is a circuit diagram showing a configuration example of a bit line current detection circuit in Embodiment 2 of the invention.

FIG. 17 is a circuit diagram showing a configuration example of the bit line current detection circuit 1606. The bit line current detection circuit 1606 includes switch circuits 1701 and 1702, a current mirror circuit 1703, NMOS transistors 1704 and 1705, a delay circuit (PLY) 1706, a determination circuit (COMP) 1707, and an SR flip-flop circuit (SRFF) 1708.

Hereinafter, operation of the bit line current detection circuit 1606 will be described. The switch circuits 1701 and 1702 are switch circuits for inputting, to the bit line current detection circuit 1606, the differential bit lines (BTL and BTLN) to be connected to the memory cell 1604 of a test target. As many switch circuits 1701 and 1702 as the number of bit lines of the memory cell array 1603 are prepared. When a test is performed, one pair of switch circuits are selected to be rendered conductive. When a test is not performed, all switch circuits are cut off to separate the bit line current detection circuit 1606 from the memory cell array 1603.

Currents Ibit flowing through the bit lines selected by the switch circuits 1701 and 1702 are generated as two copy currents Ibit by the current mirror circuit 1703. The two copy currents Ibit are converted to voltages respectively according to the currents Ibit in the NMOS transistors 1704 and 1705 that are diode-connected. N1 and N2 in FIG. 17 respectively represent nodes at which the current mirror circuit 1703 and the NMOS transistors 1704 and 1705 are connected. A signal at the node N1 is input to the determination circuit 1707, while a signal at the node N2 passes through the delay circuit 1706 to be input to the determination circuit 1707. The delay circuit 1706 generates a signal N2' that is delayed with respect to N1 by a given time. Examples of configuration of the delay circuit 1706 include a capacitance connected between N2 and a ground potential, a resistance inserted between N2 and N2', and an analog amplifier circuit inserted between N2 and N2'.

In the determination circuit 1707, a high and low relation between a difference in voltage between the signal at the node N1 and the signal N2' that are input to the determination circuit 1707 and a voltage set value that is previously set is determined. For the voltage set value, a value proportional to the amount of temporal variation desired to be detected is set. When the difference in voltage between N1 and N2' is lower than the voltage set value, the determination circuit 1707 outputs 'L' to an output signal COMPOUT. When the difference in voltage between N1 and N2' is higher than the voltage set value, the determination circuit 1707 outputs 'H' to the out signal COMPOUT. To the determination circuit 1707, the reset signal RST is input. When RST is 'L', the output signal COMPOUT outputs 'L', while when RST is 'L', a voltage comparing operation is performed.

In the SR flip-flop circuit 1708, the output signal COMPOUT of the determination circuit 1707 is input to a set terminal S, and the signal RST is connected to a reset terminal R. The SR flip-flop circuit 1708 outputs the RTN detection result DETOUT. In the SR flip-flop circuit 1708, DETOUT is set to 'L' with RST before the start of a test. When COMPOUT transits from 'L' to 'H', DETOUT is fixed to 'H'.

<Operation of Bit Line Current Detection Circuit>

Figure 18:
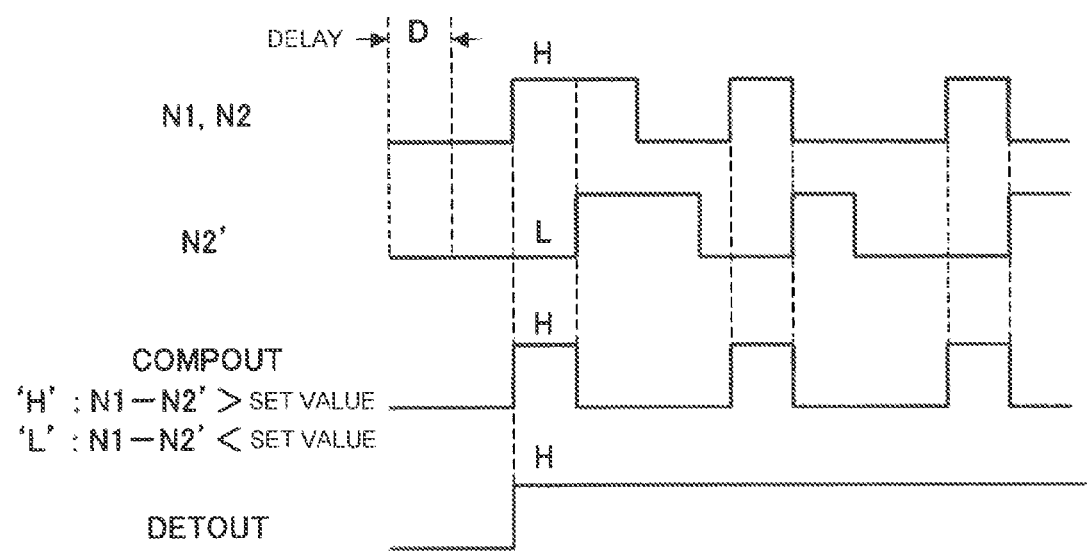
FIG. 18 shows a voltage waveform example of operation of the bit line current detection circuit in Embodiment 2 of the invention.

FIG. 18 shows a voltage waveform example of operation of the bit line current detection circuit 1606. The signal of the nodes N1 and N2 has a voltage conversion waveform of the bit line current Ibit that changes due to a temporal variation. The signal N2' is a signal obtained by delaying N2 with the delay circuit 1706 by an amount corresponding to a time indicated by D in the drawing. The output signal COMPOUT of the determination circuit 1707 outputs 'H' when N1 and N2' are compared and the voltage of N1 is higher than (N2' voltage+set voltage value) (N1−N2'>set value), and outputs in the other cases (N1−N2'<set value). FIG. 18 shows a voltage value setting example in which COMPOUT outputs 'H' when N1='H' and N2'='L'. DETOUT is fixed to 'H' when COMPOUT is 'H'. With the operation, a temporal variation occurring in the selected memory cell 1604 can be directly detected by determining the magnitude of the amount of fluctuation in the bit line current.

<Effect of Embodiment 2>

According to Embodiment 2 as described above, as an effect different from Embodiment 1, the bit line current detection circuit 1606 that detects a fluctuation in the bit line operation current of a selected memory cell and outputs the detection result is provided, so that the amount of fluctuation in bit line current can be directly detected in the test mode to thereby enhance detection efficiency for a malfunctioning cell of the SRAM due to a temporal variation.

Embodiment 3

Embodiment 3 will be described with reference to FIGS. 19 to 21.

<Test Circuit of SRAM>

Figure 19:
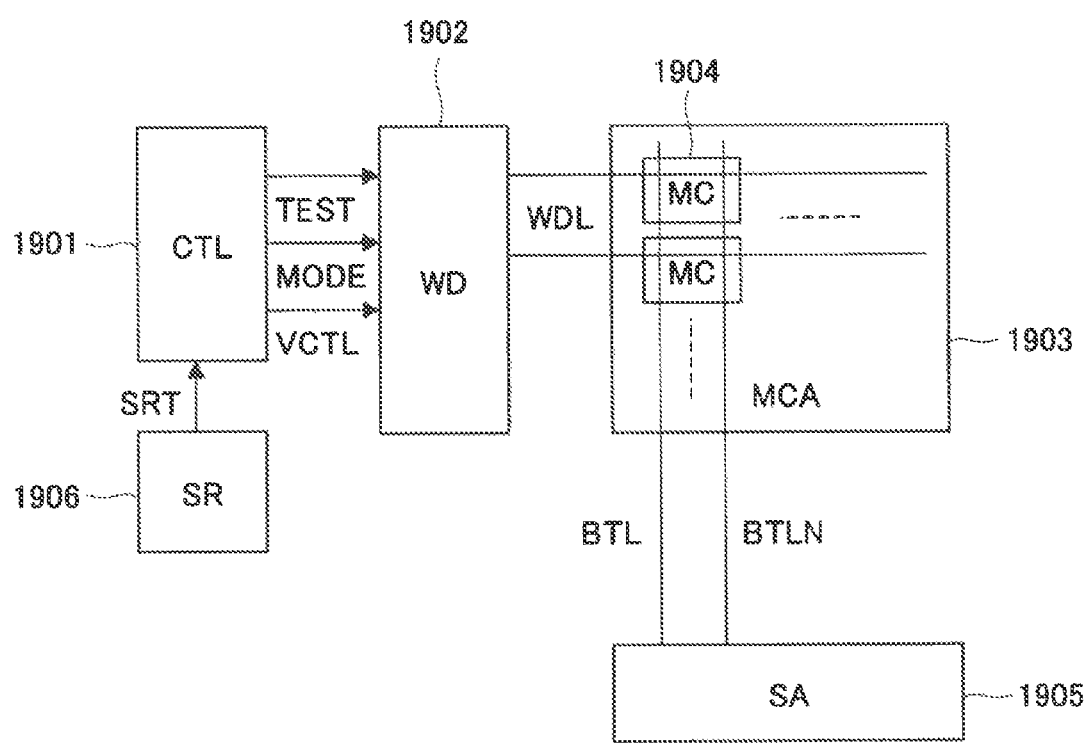
FIG. 19 is a block diagram showing a configuration example of a test method and circuit of an SRAM according to Embodiment 3 of the invention.

FIG. 19 is a block diagram showing a configuration example of a test method and circuit of an SRAM according to Embodiment 3. The test circuit of the SRAM shown in FIG. 19 includes a test/normal operation selection circuit (CTL) 1901, a word line driver circuit (WD) 1902, a memory cell array (MCA) 1903, a sense amplifier circuit (SA) 1905, and a variation detection circuit (SR) 1906. Configurations of the blocks excepting the variation detection circuit 1906 are similar to those of Embodiment 1 shown in FIG. 1, and therefore the descriptions thereof are omitted. In the following, differences from Embodiment 1 will be mainly described.

The variation detection circuit 1906 detects a temporal transistor variation of a chip, and outputs a detection result SRT of the variation to the test/normal operation selection circuit 1901. In the configuration described in Embodiment 3, a voltage given to the word line in the preparation period disposed before the write operation in the test mode is controlled in response to the situation of the transistor variation.

<Configuration of Word Line Output Circuit>

Figure 20:
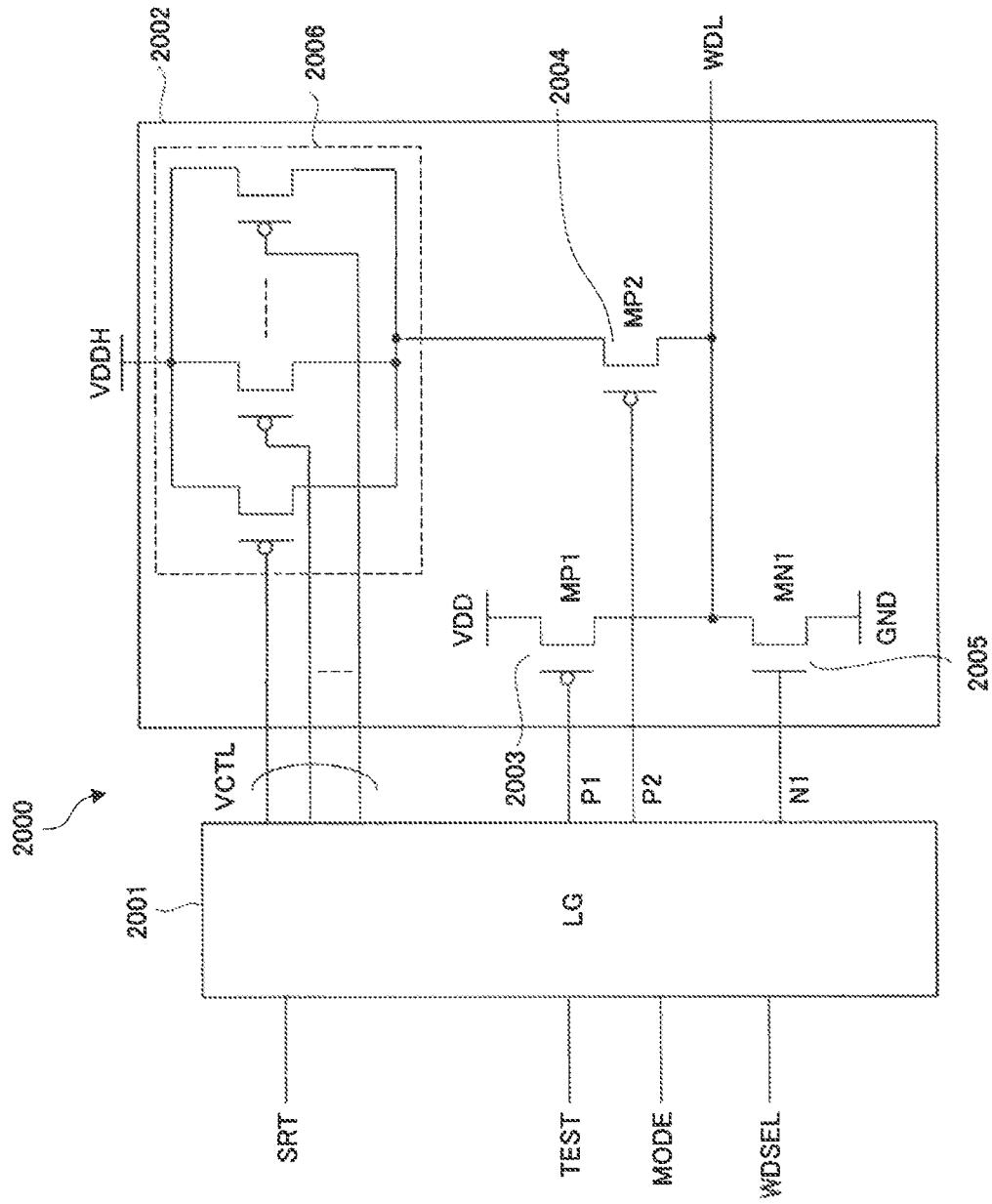
FIG. 20 is a circuit diagram showing a configuration example of a word line output circuit in Embodiment 3 of the invention.

FIG. 20 is a circuit diagram showing a configuration example of a word line output circuit 2000. The word line output circuit 2000 can switch three voltages of the first voltage (VDD), the second voltage (GND), and the third voltage (VDDH) to drive the word line (WDL), similarly to Embodiment 1 shown in FIG. 1. In addition to this, the third voltage (VDDH) is variable, which is different from Embodiment 1.

The word line output circuit 2000 includes a test/normal operation switching logic circuit (LG) 2001 and a drive circuit 2002. To the test/normal operation switching logic circuit 2001, the signals TEST, MODE, and WDSEL and the signal SRT of a detection result are input. The test/normal operation switching logic circuit 2001 outputs control signals P1, P2, and N1 of the drive circuit 2002 and control signals VCTL. The drive circuit 2002 includes two PMOS transistors (MP1) 2003 and (MP2) 2004, one NMOS transistor (MN1) 2005, and a voltage control circuit 2006. Source terminals of the PMOS transistors 2003 and 2004 and the NMOS transistor 2005 are respectively connected to the first voltage (VDD), the third voltage (VDDH), and the second voltage (GND). The signals P1, P2, and N1 are respectively connected to gate terminals of the transistors 2003, 2004, and 2005. Drain terminals of the transistors 2003, 2004, and 2005 are connected in common to the word line (WDL).

The voltage control circuit 2006 includes one or a plurality of (an example of a plurality of PMOS transistors is shown in the drawing) PMOS transistors. Gate terminals of the PMOS transistors are connected to the control signals VCTL of the test/normal operation switching logic circuit 2001. As many signals VCTL as the number of PMOS transistors of the voltage control circuit 2006 are prepared. When VCTL is the PMOS transistor of the voltage control circuit 2006 is turned off. When VCTL is 'L', the PMOS transistor is turned on. The voltage control circuit 2006 is a circuit that steps down the voltage of the third voltage (VDDH). The number of PMOS transistors to rendered conductive, the PMOS transistors constituting the voltage control circuit 2006, is controlled by the signal VCTL, so that the step-down voltage of the third voltage is determined. The voltage control circuit 2006 outputs a voltage closer to the third voltage as the number of PMOS transistors to be rendered conductive is increased. The voltage is connected to a source terminal of the PMOS transistor 2004 and connected to the word line WDL via the PMOS transistor 2004.

<Configuration of Variation Detection Circuit>

Figure 21:
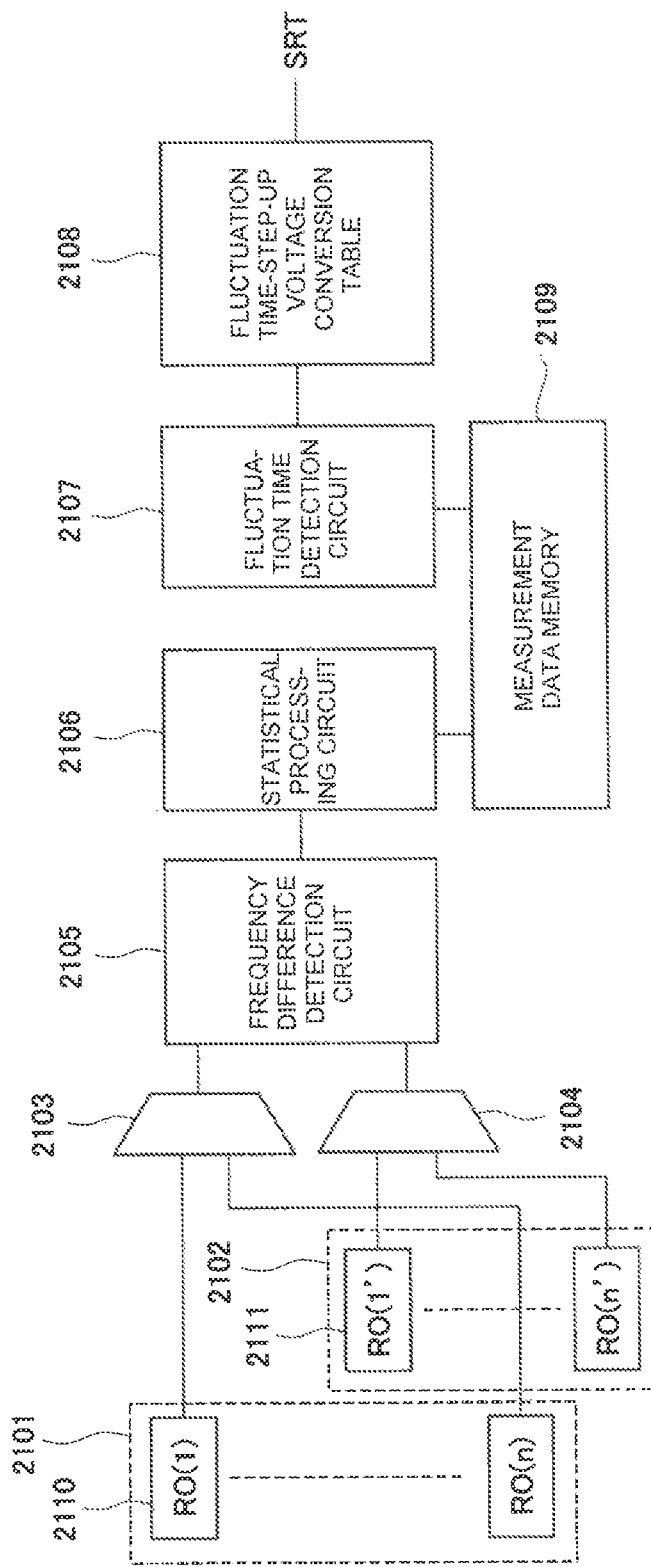
FIG. 21 is a block diagram showing a configuration example of a variation detection circuit in Embodiment 3 of the invention.

FIG. 21 is a block diagram showing a configuration example of the variation detection circuit 1906. The variation detection circuit 1906 includes ring oscillator blocks 2101 and 2102 respectively including one or a plurality of (an example of a plurality (a pieces) of ring oscillators is shown in the drawing) ring oscillators 2110 and 2111, selectors 2103 and 2104, a frequency difference detection circuit 2105, a statistical processing circuit 2106, a fluctuation time detection circuit 2107, a fluctuation time-step-up voltage conversion table 2108, and a measurement data memory 2109.

Operation of the variation detection circuit 1906 will be described. The variation detection circuit 1906 is a circuit that detects a random transistor variation in the chip and obtains a temporal fluctuation of the variation. The variation detection circuit 1906 selects, with the selectors 2103 and 2104, oscillation output signals of one of the ring oscillators 2110 and one of the ring oscillators 2111 from the ring oscillator block's 2101 and 2102, and outputs the signals to the frequency difference detection circuit 2105.

The frequency difference detection circuit 2105 includes counters and measures a difference in frequency between the ring oscillators 2110 and 2111. For the measurement of the difference in frequency, a method is conceivable in which a difference in the number of counts after a lapse of a reference time that is input externally with a clock signal or the like is measured. Moreover, a method is also conceivable in which when one of the counters counts to a highest-order bit of the counter, the other counter is stopped and a difference in the number of counts at that time is used. In either methods, for a difference in oscillating frequency, code information indicating which of the ring oscillator 2110 and 2111 has a higher oscillating frequency and count number information indicating a difference in oscillating frequency are used.

After measuring one difference in frequency, ring oscillator outputs to be selected are switched by the selectors to select the next ring oscillators, and a difference in frequency is detected. In the statistical processing circuit 2106, statistical operations such as square sum, dispersion, and standard deviation are performed on the detected differences in frequency to detect a random transistor variation, and the result is stored in the measurement data memory 2109.

The random variation detection operation described above is repeated a plurality of times at given period intervals. As a result, time-series data of statistical operation results is stored in the measurement data memory 2109. In the fluctuation time detection circuit 2107, a fluctuation time interval of the data stored in the measurement data memory 2109 is measured.

The fluctuation time-step-up voltage conversion table 2108 is a table in which the fluctuation time interval of the data of the measurement data memory 2109 and the third voltage (VDDH) given to the word line are associated with each other. In the table, as the fluctuation time interval increases, also the third voltage becomes higher. This corresponds to the fact that the probability in which a temporally fluctuating variation due to RTN is brought into a high threshold voltage state is increased when a high voltage is applied to a gate terminal of a transistor. Voltage information SRT of the table is represented by, for example, the number of PMOS transistors of the voltage control circuit 2006 to be rendered conductive.

<Effect of Embodiment 3>

According to Embodiment 3 as described above, as an effect different from Embodiment 1, the variation detection circuit 1906 that detects a temporal transistor variation of the chip and outputs this detection result to the test/normal operation selection circuit 1901 is provided, so that in the write test mode, a word line voltage given in the preparation period before the write operation can be controlled based on variation detection information. Due to this, malfunction of the SRAM due to a temporally fluctuating variation can be efficiently detected.

The invention made by the present inventors has been specifically described above based on the embodiments. However, it is needless to say that the invention is not limited to the embodiments but can be variously modified within a scope not departing from the gist thereof. For example, the embodiments have been described in detail for easy understanding of the invention, and the invention is not limited to those having all the configurations described above. Moreover, a part of the configuration of one embodiment can be replaced by the configuration of another embodiment, and the configuration of one embodiment can be added with the configuration of another embodiment. Furthermore, a part of the configuration of each of the embodiments can be added with, removed from, and replaced by another configuration.

The semiconductor integrated circuit device of the invention is not limited to an SRAM but can be applied generally to a semiconductor integrated circuit device having an SRAM. For example, the technique is particularly usefully applied to a semiconductor integrated circuit device having an SRAM mounted thereon, such as a microcomputer or a processor.

What is claimed is:

1. A semiconductor integrated circuit device comprising:
a plurality of memory cells; and
a control circuit that controls the plurality of memory cells, wherein
each of the memory cells has a transfer MOS transistor whose gate is connected to a word line, and
the control circuit applies
a first voltage to the word line at the time of a write operation of the memory cell,
a second voltage to the word line at the end of the write operation, and
a third voltage to the word line in a preparation period after selecting the memory cell and before writing test data.

2. The semiconductor integrated circuit device according to claim 1, wherein
the control circuit applies
the first voltage to the word line at the time of a read operation of the memory cell,
the second voltage to the word line at the end of the read operation, and
the second voltage to the word line in a preparation period after selecting the memory cell and before reading test data.

3. The semiconductor integrated circuit device according to claim 1, wherein
the control circuit has a logic circuit and a drive circuit,
the drive circuit has first and second PMOS transistors and an NMOS transistor,
outputs of the logic circuit are connected to gate terminals of the first and second PMOS transistors and the NMOS transistor,
the first voltage is connected to the first PMOS transistor, and the third voltage is connected to the second PMOS transistor.

4. The semiconductor integrated circuit device according to claim 3, wherein
the logic circuit outputs
in a test mode, a signal that selectively renders the first PMOS transistor and the second PMOS transistor conductive, and
in a normal operation mode, a signal that simultaneously renders the first PMOS transistor and the second PMOS transistor conductive or cut-off.

5. The semiconductor integrated circuit device according to claim 3, wherein
the drive circuit is short-circuited between the first voltage and the second voltage in the normal operation mode.

6. The semiconductor integrated circuit device according to claim 1, wherein
the third voltage has a voltage level higher than that of the first voltage, and the first voltage has a voltage level higher than that of the second voltage.

7. The semiconductor integrated circuit device according to claim 1, wherein
the control circuit applies
the first voltage to the word line at the time of the read operation of the memory cell,
the second voltage to the word line at the end of the read operation, and
a fourth voltage having a voltage level lower than that of the second voltage to the word line in the preparation period after selecting the memory cell and before reading test data.

8. The semiconductor integrated circuit device according to claim 7, wherein
the control circuit has a logic circuit and a drive circuit,
the drive circuit has first and second PMOS transistors and first and second NMOS transistors,
outputs of the logic circuit are connected to gate terminals of the first and second PMOS transistors and the first and second NMOS transistors,
the first voltage is connected to the first PMOS transistor, the third voltage is connected to the second PMOS transistor, the second voltage is connected to the first NMOS transistor, and the fourth voltage is connected to the second NMOS transistor.

9. The semiconductor integrated circuit device according to claim 1, wherein
the control circuit has a bit line current detection circuit that is connected to bit lines of the memory cells, detects a fluctuation in bit line operation current of the memory cell selected, and outputs the detection result.

10. The semiconductor integrated circuit device according to claim 9, wherein
the bit line current detection circuit has
a current mirror circuit that generates, based on a current flowing through the bit line of the selected memory cell, first and second currents changing due to a temporal variation, and
a determination circuit that compares a first voltage based on the first current with a third voltage obtained by delaying a second voltage based on the second current, and determines whether or not a difference voltage between the first voltage and the third voltage is higher than a voltage set value that is proportional to the amount of temporal variation desired to be detected.

11. The semiconductor integrated circuit device according to claim 1, wherein
the control circuit has
a variation detection circuit that detects a temporal transistor variation of a chip and outputs the detection result, and
a voltage control circuit that determines, based on an output from the variation detection circuit, a step-down voltage of the third voltage.

12. The semiconductor integrated circuit device according to claim 11, wherein
the variation detection circuit has
a frequency difference detection circuit that detects a difference in oscillating frequency from ring oscillators selected from a plurality of ring oscillators,
a statistical processing circuit that performs a statistical operation on the difference in frequency detected by the frequency difference detection circuit to detect a random transistor variation, and stores in time series the result in a measurement data memory,
a fluctuation time detection circuit that measures a fluctuation time interval of time-series data stored in the measurement data memory, and
a fluctuation time-step-up voltage conversion table in which the fluctuation time interval of the data of the measurement data memory and the third voltage are associated with each other.

* * * * *